US010910226B2

(12) United States Patent
Lell et al.

(10) Patent No.: US 10,910,226 B2
(45) Date of Patent: Feb. 2, 2021

(54) METHOD OF PRODUCING A SEMICONDUCTOR LASER AND SEMICONDUCTOR LASER

(71) Applicant: OSRAM Opto Semiconductors GmbH, Regensburg (DE)

(72) Inventors: Alfred Lell, Maxhütte-Haidhof (DE); Georg Brüderl, Burglengenfeld (DE); John Brückner, Regensburg (DE); Sven Gerhard, Alteglofsheim (DE); Muhammad Ali, Regensburg (DE); Thomas Adlhoch, Brennberg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/335,968

(22) PCT Filed: Oct. 25, 2017

(86) PCT No.: PCT/EP2017/077318
§ 371 (c)(1),
(2) Date: Mar. 22, 2019

(87) PCT Pub. No.: WO2018/077954
PCT Pub. Date: May 3, 2018

(65) Prior Publication Data
US 2020/0028024 A1    Jan. 23, 2020

(30) Foreign Application Priority Data
Oct. 28, 2016    (DE) .................. 10 2016 120 685

(51) Int. Cl.
*H01L 21/285*     (2006.01)
*H01S 5/042*      (2006.01)
(Continued)

(52) U.S. Cl.
CPC ...... *H01L 21/28575* (2013.01); *H01L 21/268* (2013.01); *H01L 33/005* (2013.01);
(Continued)

(58) Field of Classification Search
None
See application file for complete search history.

(56) References Cited

U.S. PATENT DOCUMENTS 8,865,591 B2    10/2014    Tamari et al.
2005/0020095 A1  1/2005    Bauer et al.
(Continued)

FOREIGN PATENT DOCUMENTS

CN    1404641 A     3/2003
CN    101471253 A   7/2009
(Continued)

OTHER PUBLICATIONS

Decision to Grant A Patent dated Jan. 7, 2020, of counterpart Japanese Application No. 2019-503716, along with an English translation.
(Continued)

*Primary Examiner* — Steven B Gauthier
(74) *Attorney, Agent, or Firm* — DLA Piper LLP (US)

(57) ABSTRACT

A method of manufacturing a semiconductor laser including providing a substrate having a semiconductor layer sequence with an active layer that generates light during operation of the semiconductor laser, applying a continuous contact layer having at least one first partial region and at least one second partial region on a bottom side of the substrate opposite the semiconductor layer sequence, and locally annealing the contact layer only in the at least one first partial region.

14 Claims, 14 Drawing Sheets

(51) Int. Cl.
*H01L 33/00* (2010.01)
*H01L 21/268* (2006.01)
(52) U.S. Cl.
CPC ...... *H01S 5/04252* (2019.08); *H01S 5/04254* (2019.08); *H01L 21/28587* (2013.01); *H01L 2933/0016* (2013.01); *H01S 5/04256* (2019.08)

(56) References Cited

U.S. PATENT DOCUMENTS

| | | | |
|---|---|---|---|
| 2005/0104072 A1* | 5/2005 | Slater, Jr. | H01L 33/40 257/77 |
| 2007/0023775 A1 | 2/2007 | Jang | |
| 2007/0264802 A1 | 11/2007 | Sakamoto et al. | |
| 2007/0264804 A1 | 11/2007 | Gallia | |
| 2008/0268560 A1* | 10/2008 | Ploessl | H01L 33/405 438/29 |
| 2009/0170304 A1 | 7/2009 | Tarui et al. | |
| 2010/0032839 A1 | 2/2010 | Koumoto et al. | |
| 2010/0200863 A1 | 8/2010 | Sasaki | |
| 2014/0064311 A1* | 3/2014 | Eichler | H01S 5/2218 372/45.01 |

FOREIGN PATENT DOCUMENTS

| | | |
|---|---|---|
| CN | 101 908 591 A | 12/2010 |
| CN | 102460863 A | 5/2012 |
| CN | 103001119 A | 3/2013 |
| DE | 10141352 A1 | 6/2003 |
| DE | 10 2004 061 865 A1 | 3/2006 |
| DE | 10 2011 100 175 A1 | 11/2012 |
| EP | 1276186 A1 | 1/2003 |
| EP | 2133965 A3 | 2/2011 |
| JP | 2006-310443 A | 11/2006 |
| JP | 2009-158745 A | 7/2009 |
| WO | 2008/081566 A1 | 7/2008 |

OTHER PUBLICATIONS

Kim, S. J. et al. (Dec. 31, 2013) "Improved thermal stability and reduced contact resistance of ohmic contacts on N-Face n-type GaN with laser-assisted doping" *IEEE Electron Device Letters,* vol. 34, No. 3, pp. 372-374 [Abstract only].
Li, S.-G. et al. (Jan. 15, 2015) "Characteristic study of ohmic contact alloy layer in InAs/InP quantum dot lasers" *Guangdianzi Jiguang/Journal of Optoelectronics Laser,* vol. 26, pp. 30-34 [Abstract only].
Harvard, E. et al. (Mar. 2008) "Effect of thermal annealing on the electrical properties of indium tin oxide (ITO) contact on Be-doped GaAs for optoelectronic applications" *Semiconductor Science and Technology,* vol. 23, Issue 3, 4 pages. [Abstract only].
The First Office Action dated May 18, 2020, of counterpart Chinese Application No. 201780067125.8, along with an English translation.

* cited by examiner

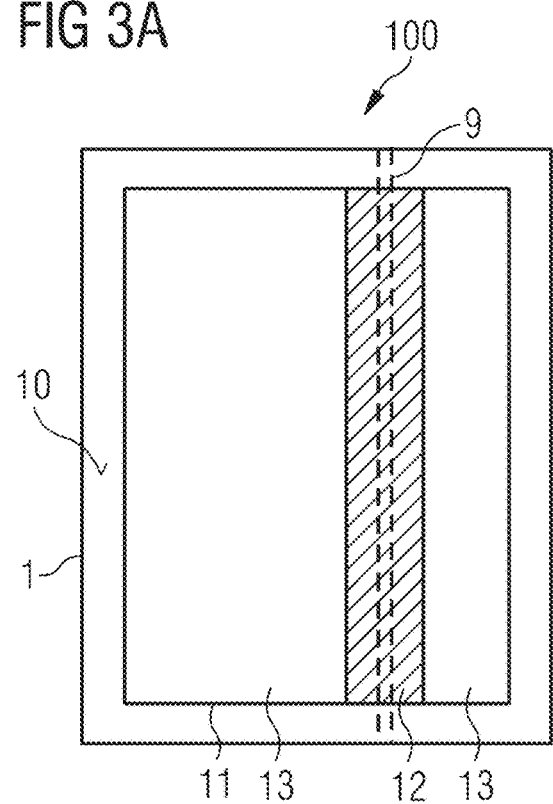
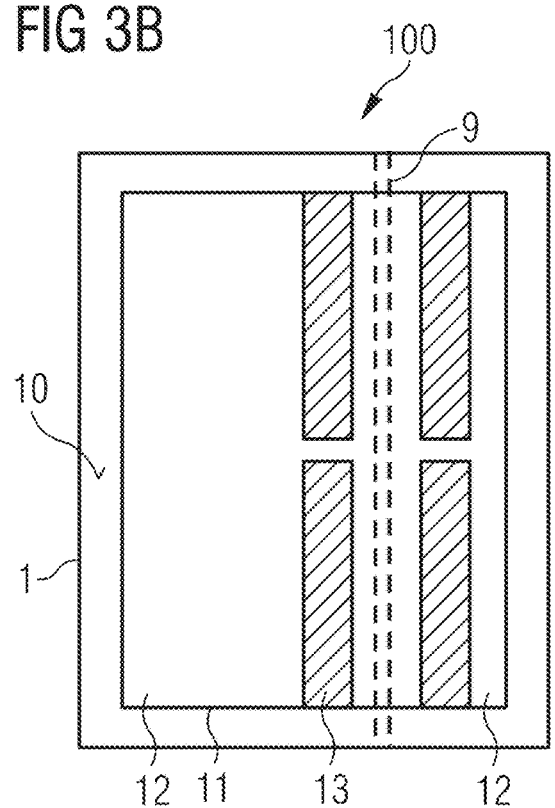
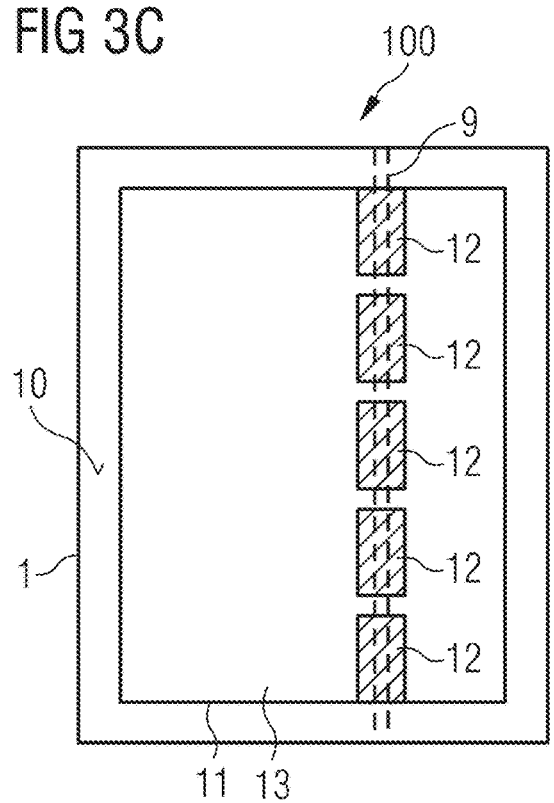

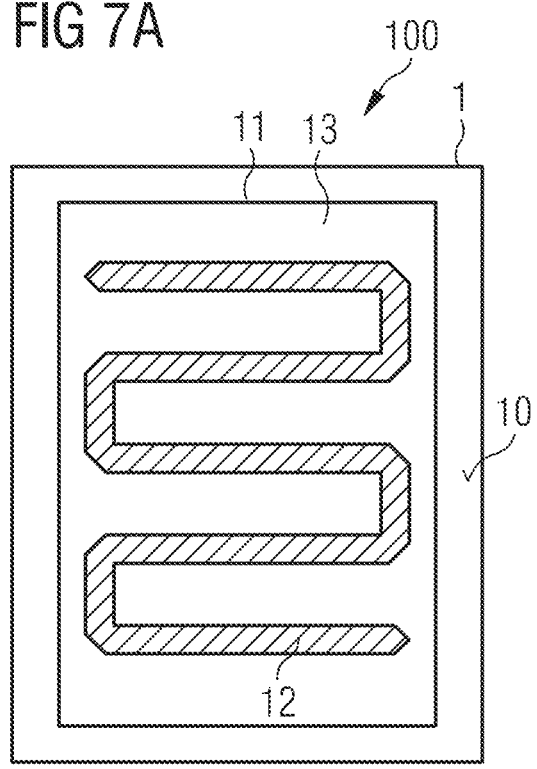
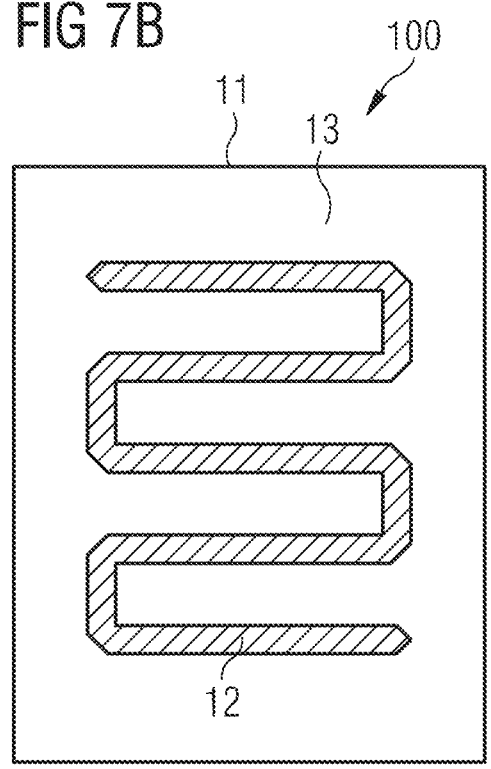
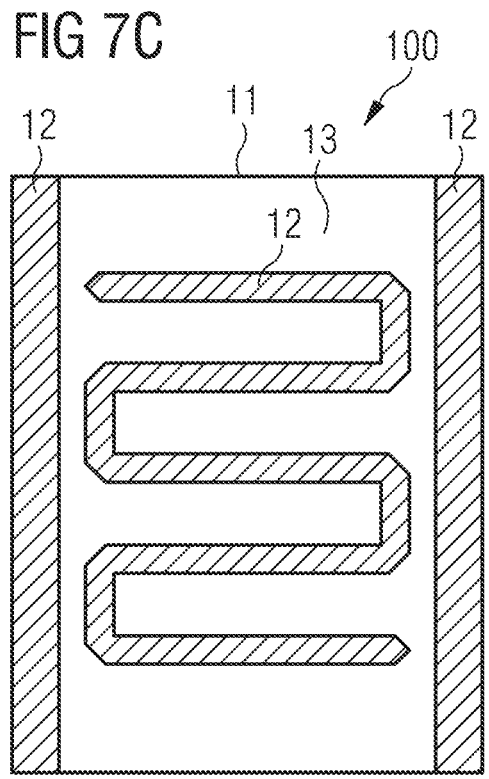
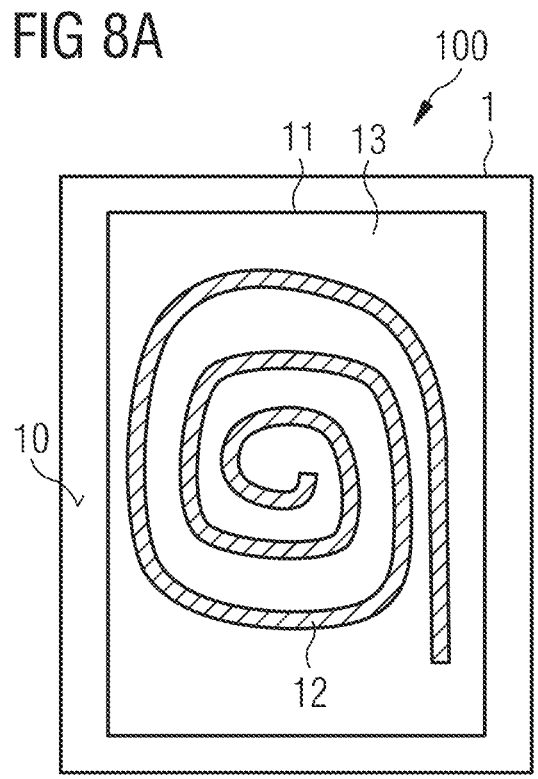

METHOD OF PRODUCING A SEMICONDUCTOR LASER AND SEMICONDUCTOR LASER

TECHNICAL FIELD

This disclosure relates to a method of manufacturing a semiconductor laser and a semiconductor laser.

BACKGROUND

Laser diodes in the spectral range from ultraviolet to infrared are increasingly opening up new markets, for example, in the area of lighting, projection and material processing applications, where their advantages over light-emitting diodes, for example, in terms of increased luminance come into play. Such laser diodes are usually based substantially on epitaxial structures with as few defects as possible, for example, on GaN or GaAs substrates, where the n-contact is applied to the rear side of the substrate. As experiments have shown, a significant voltage drop contribution appears at this n-contact, which can be problematic as the efficiency of the laser diodes can be reduced and thus the component stability can also be negatively impaired.

SUMMARY

We provide a method of manufacturing a semiconductor laser including providing a substrate having a semiconductor layer sequence with an active layer that generates light during operation of the semiconductor laser, applying a continuous contact layer having at least one first partial region and at least one second partial region on a bottom side of the substrate opposite the semiconductor layer sequence, and locally annealing the contact layer only in the at least one first partial region.

We also provide a semiconductor laser including a substrate having a semiconductor layer sequence with an active layer that generates light during operation of the semiconductor laser, and a contact layer on a bottom side of the substrate opposite the semiconductor layer sequence, and wherein the contact layer has at least one first partial region and at least one second partial region which are formed contiguously, and the at least one first partial region is annealed and the at least one second partial region is unannealed.

We further provide a method of manufacturing a semiconductor laser including providing a substrate having a semiconductor layer sequence with an active layer that generates light during operation of the semiconductor laser, applying a continuous contact layer having at least one first partial region and at least one second partial region on a bottom side of the substrate opposite the semiconductor layer sequence, and locally annealing the contact layer only in the at least one first partial region, wherein each second partial region remains unannealed in the finished semiconductor laser.

BRIEF DESCRIPTION OF THE DRAWINGS

FIGS. 2A to 9C show schematic illustrations of semiconductor lasers according to further examples.

Figure 1A:
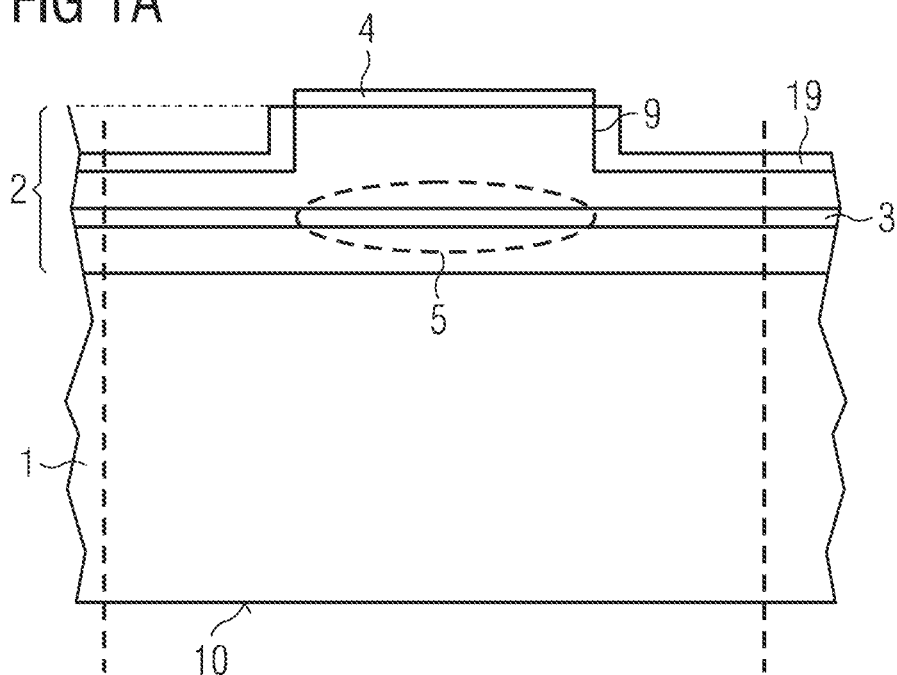
FIGS. 1A to 1E show schematic illustrations of a method of manufacturing a semiconductor laser according to an example.

REFERENCE LIST 1 substrate
2 semiconductor layer sequence
3 active layer
4 electrode layer
5 active area
6 light outcoupling surface
7 rear surface
8 light
9 ridge waveguide structure
10 bottom side
11 contact layer
12 first partial region
13 second partial region
14 layer
20 surface structure
19 passivation layer
90 irradiation
100 semiconductor laser diode

DETAILED DESCRIPTION

In our method of manufacturing a semiconductor laser diode, an active layer may be provided, which is embodied and intended to generate light during operation of the semiconductor laser diode. A semiconductor laser diode may have at least one active layer embodied and intended to generate light in an active region during operation. The examples and features described below apply equally to the semiconductor laser diode and to the method of manufacturing the semiconductor laser diode.

In particular, the active layer can be part of a semiconductor layer sequence with a plurality of semiconductor layers. For example, the active layer can have exactly one active area by which laser light can be emitted during operation. The active region can be defined at least partially by a contact surface of the semiconductor layer sequence with an electrode layer on the semiconductor layer sequence, i.e. at least partially by a surface over which current is applied to the semiconductor layer sequence and thus into the active layer. Furthermore, the active area can at least partially be defined by a ridge waveguide structure, i.e. a ridge formed in the form of an elongated elevation in the semiconductor material of the semiconductor layer sequence. Furthermore, the active layer can also have a plurality of active areas that can be formed by a corresponding plurality of one or more of the described measures.

The semiconductor layer sequence can in particular be an epitaxial layer sequence, i.e. an epitaxially grown semiconductor layer sequence. The semiconductor layer sequence can be based on InAlGaN, for example InAlGaN-based semiconductor layer sequences include in particular those in which the epitaxially produced semiconductor layer sequence generally comprises a layer sequence of different individual layers containing at least one individual layer comprising a material from the III-V compound semiconductor material system $In_xAl_yGa_{1-x-y}N$—with $0 \le x \le 1$, $0 \le y \le 1$ and $x+y \le 1$. In particular, the active layer can be based on such a material. Semiconductor layer sequences that have at least one active layer based on InAlGaN can, for example, emit electromagnetic radiation in an ultraviolet to green wavelength range. Alternatively or additionally, the semiconductor layer sequence can also be based on InAlGaP, i.e. the semiconductor layer sequence can have different individual layers, of which at least one individual layer, e.g. the active layer, comprises a material made of the III-V compound semiconductor material system $In_xAl_yGa_{1-x-y}P$ with $0 \leq x \leq 1$, $0 \leq y \leq 1$ and $x+y \leq 1$. Semiconductor layer sequences having at least one active layer based on InAlGaP can, for example, preferably emit electromagnetic radiation with one or more spectral components in a green to red wavelength range. Alternatively or additionally, the semiconductor layer sequence may also comprise other III-V compound semiconductor material systems such as an InAlGaAs-based material or II-VI compound semiconductor material systems. In particular, an active layer of a semiconductor laser comprising an InAlGaAs based material may be capable of emitting electromagnetic radiation having one or more spectral components in a red to infrared wavelength range. A II-VI compound semiconductor material may have at least one element from the second main group such as Be, Mg, Ca, Sr, and one element from the sixth main group such as O, S, Se. For example, the II-VI compound semiconductor materials include ZnO, ZnMgO, CdS, ZnCdS and MgBeO.

The active layer and, in particular, the semiconductor layer sequence with the active layer can be arranged on a substrate. In particular, the substrate with the semiconductor layer sequence with the active layer can be provided. For example, the substrate can be a growth substrate on which the semiconductor layer sequence is grown. The active layer and, in particular, a semiconductor layer sequence with the active layer can be grown by an epitaxial process, for example, by metal-organic vapor phase epitaxy (MOVPE) or molecular beam epitaxy (MBE), on the growth substrate formed as a wafer and, furthermore, provided with electrical contacts. Furthermore, it may also be possible that the growth substrate is removed after the growth process. In this example, the semiconductor layer sequence can also be transferred to a substrate embodied as a carrier substrate after growth. The substrate may comprise a semiconductor material such as a compound semiconductor material system mentioned above or other material. In particular, the substrate can be electrically conductive and, for example, contain Ga. In this example, the substrate may contain or be made of GaAs, GaP and/or GaN. Alternatively or additionally, the substrate can also comprise InP, SiC, Si and/or Ge or be made of such a material.

For example, the active layer may comprise a conventional pn-junction, a double heterostructure, a single quantum well structure (SQW structure), or a multiple quantum well structure (MQW structure) for light generation. In addition to the active layer, the semiconductor layer sequence can also comprise other functional layers and functional regions such as p- or n-doped charge carrier transport layers, i.e. electron or hole transport layers, undoped or p- or n-doped confinement, cladding or waveguide layers, barrier layers, planarization layers, buffer layers, protective layers and/or electrodes as well as combinations thereof. Moreover, additional layers such as buffer layers, barrier layers and/or protective layers can also be arranged perpendicular to the growth direction of the semiconductor layer sequence, for example, around the semiconductor layer sequence, i.e. on the side surfaces of the semiconductor layer sequence.

A contact layer may be applied to the bottom side of the substrate opposite the semiconductor layer sequence. Together with the electrode layer on the semiconductor layer sequence described above, by which, depending on its realization, an active area can be defined the contact layer applies current to the semiconductor layer sequence and, in particular, into the active layer during operation of the semiconductor laser. The side on which the electrode layer is applied can also be referred to as the epitaxial side, while the side on which the contact layer is applied can be referred to as the substrate side. The contact layer has at least one first partial region and at least one second partial region that are formed contiguously. In other words, the at least one first partial region and the at least one second partial region form a continuous part of the contact layer and can in particular directly adjoin each other in a lateral direction. A lateral direction is defined as a direction parallel to the bottom side of the substrate and thus preferably parallel to the main plane of the active layer and the other semiconductor layers of the semiconductor layer sequence. That the contact layer comprises at least one first and at least one second partial region means that the contact layer comprises one or a plurality of first partial regions and one or a plurality of second partial regions, all of which are laterally contiguous and together form a layer. In particular, each of the first partial regions may be directly adjacent to at least one second partial region and vice versa. As a result, the contact layer may have a plurality of first partial regions separated from each other by one or more second partial regions, which are tempered locally. The at least one first partial region may have one or more geometric shapes selected from: line, cross, circle, ellipse, spiral, grid, square, wavy line.

The contact layer may be annealed only in the at least one first partial region. In particular, this may mean that the contact layer is not annealed in any of the one or more second partial regions, but only locally in the one or more first partial regions of the contact layer. The annealing can be caused by an increase in temperature locally in the at least one first partial region. By the annealing, a mixing of materials of the contact layer can occur in the at least one first partial region. Furthermore, a mixing of materials of the contact layer and materials of the substrate can occur. The annealing can thus cause the contact layer to be alloyed into at least the first partial region. In contrast, the contact layer can remain unchanged in the at least one second partial region so that no material mixing and thus no alloying takes place in the at least one second partial region. If the contact layer has a layer structure in the form of a layer stack, this structure can be retained in the at least one second partial region, while this structure is altered in the at least one first partial region by the alloying. The semiconductor laser can thus have a continuous contact layer with at least one first partial region and at least one second partial region on a bottom side of the substrate opposite the semiconductor layer sequence, wherein the at least one first partial region is annealed and the at least one second partial region is unannealed. The at least one second partial region remains unannealed, especially in the finished semiconductor laser. This also applies to each of the second partial regions in a contact layer with a plurality of second partial regions.

After growing in the form of a wafer on a substrate, the semiconductor layer sequence may first be processed on the side facing away from the substrate, which can also be referred to as the epitaxial side compared to the substrate side as described above. The epitaxial side may preferably be the p-side of the semiconductor layer sequence, while the substrate side may be the n-side of the semiconductor layer sequence. Alternatively, the polarity of the semiconductor layer sequence can also be reversed. When processing the epitaxial side, the active regions of a large number of semiconductor lasers are usually generated, for example, by the production of ridge waveguide structures, which then receive a lateral dielectric passivation. The electrode layer for contacting the epitaxial side is deposited on top thereof. Subsequently, the substrate can be thinned to achieve improved facet breaking and/or reduced operating voltage during later operation of the semiconductor lasers. The contact layer can then be applied to the bottom side of the substrate and annealed locally in the first areas. After applying the contact layer on the substrate side, the wafer process can be completed. By subsequent breaking of the laser facets, laser bars with a large number of active areas can be produced. Then, the facets can be provided with mirror properties. Furthermore, a laser bar can be separated into laser bars with less active areas or into individual lasers. The semiconductor laser described here can thus be a single laser with one active region or a laser bar with a plurality of active regions. In process steps carried out in a wafer composite, the term semiconductor laser can also apply to the areas of the wafer corresponding to the later singulated semiconductor lasers.

In laser diodes in which the contact on the substrate side is not thermally alloyed, the contact shows only inadequate ohmic behavior. However, such an alloying is often avoided in the state of the art since the previously applied epitaxial-side electrode layer would suffer electrical voltage losses at typical temperature conditions of 250° C. to 500° C., depending on the material system and the contact materials. In addition, at the elevated temperatures of the alloying process, a mixing of the contact materials typically applied in layer stacks would occur. Furthermore, in a Ga-containing substrate, for example, gallium from the substrate as well as titanium, when it is used, for example, as an adhesion promoter layer of a contact, could partially reach the surface of the component and could, via corresponding oxide formation, impair or even prevent bond wire bonding or soldering of the component during the assembly process.

A potential way of avoiding damage to the epitaxial contact when alloying the substrate contact is to reverse part of the process sequence by applying the epitaxial contact only after alloying the substrate contact. However, this process sequence requires the wafer be thinned before the long process sequence on the epitaxial side such as activation, fabrication of ridge waveguide structures, passivation, metallization and/or mesa etching. Thus, this reverse process sequence has the significant disadvantage that most technological steps provide an increased risk of breakage due to the thinned wafer so that high yield losses are to be expected.

The local annealing may be carried out by irradiation. In particular, the contact layer may be irradiated from the side facing away from the substrate. In particular, a laser-based irradiation method can be used as the irradiation method. A laser can therefore be used to irradiate the contact layer and the bottom side of the substrate from the side of the contact layer facing away from the substrate. The selective irradiation of the contact layer in the at least one first partial region can be achieved by using a laser so that a local heating and thus a local annealing can be achieved. Selective irradiation can be carried out by scanning so that local heating can be targeted with regard to the size, shape and number of the first partial regions. For effective heating, laser light in particular can be used, which is at least partially absorbed by the substrate. Alternatively or additionally, laser light can be used which is at least partially absorbed by one or more materials of the contact layer. As an alternative to a laser, it may also be possible to use a different light source such as focused light from one or more light emitting diodes and/or halogen lamps and/or gas discharge lamps.

The contact layer may be applied over the entire surface on the bottom side of the substrate. This can mean in particular that the semiconductor laser has a contact layer that completely covers the bottom side of the substrate.

The contact layer may be applied such that an edge region of the bottom side of the substrate of the semiconductor laser is free of the contact layer. In particular, a circumferential edge region of the bottom side of the substrate of the semiconductor laser can be free of the contact layer so that the contact layer does not reach the substrate edge in the lateral direction in a circumferential region. A corresponding structuring of the contact layer can already take place in the wafer compound, i.e. before separation into individual semiconductor lasers, whereby each area corresponding to a later separated semiconductor laser has a corresponding edge region free of the contact layer. The regions being free of the contact layer allow easier singulation along these regions. In particular, uncontrolled tearing of the contact layer and associated unintentional "fraying" of the contact layer during singulation can be prevented.

The contact layer may have at least one metallic layer, i.e. a layer with one or more metals, a metal alloy and/or a metal mixture. In particular, the contact layer can have a stack of layers with several metallic layers. In this example, the contact layer is particularly preferred to have an adhesive layer directly adjacent to the bottom side of the substrate, for example, with or made of Ti. On an upper side facing away from the substrate, the contact layer can have a layer with or made of Au, which, for example, is intended and embodied as a bond layer for wire bonding. In this example, the bond layer may preferably have a thickness of greater than or equal to 400 nm and less than or equal to 1.5 µm. In between, the contact layer may have one or more other layers such as diffusion barrier layers, for example, with or made of one or more materials selected from Pt, Pd, Ni, Cr and TiWN. If the contact layer is provided for soldering the semiconductor laser, one or more further layers, in particular, for example, a further diffusion barrier layer with one or more of the aforementioned materials and/or a further layer with or made of Au, which is thinner than the bond layer described above, may be applied instead of or on the bond layer described above. Local annealing in the at least one first partial region can in particular result in an Au-containing layer becoming brittle and thus no longer suitable for wire bonding or soldering. As the at least one second partial region remains unannealed, the at least one second partial region can be used to connect the contact layer by bonding or soldering.

The bottom side of the substrate may have a surface structure. In particular, the surface structure may have a depression in the at least one first partial region. The depression can, for example, be made by etching before the contact layer is applied. Thus, partial annealing of the contact layer can be combined with partial surface structures such as those produced by etching. In this way, an additional operating voltage reduction can be achieved by reducing the substrate thickness in these regions. If the at least one first partial region is located in an edge region of the bottom side of the substrate of the semiconductor laser, an additional depression produced in this region can facilitate separation.

A further layer of the contact layer may be applied after local annealing. The further layer can be applied to the at least one first and/or second partial region. In particular, the second layer can be applied over a large area, i.e. on the first and second partial regions and can, for example, have Au or be made of Au. If the bottom side of the substrate has a surface structure, i.e. in particular one or more depressions, the further layer can also be used for planarization.

The at least one first partial region may be applied at least partially in an edge region of the bottom side of the substrate of the semiconductor laser in which a separation is carried out. In this example it can be advantageous if the substrate is also damaged by the local annealing, in particular by irradiation such that a fracture nucleation is initiated for singulating the wafer and/or a laser bar.

The semiconductor layer sequence of the semiconductor laser may have a ridge waveguide structure. The ridge waveguide structure can in particular be formed by a ridge-shaped, longitudinally extending elevated area of the semiconductor layer sequence. The side surfaces bounding the ridge waveguide structure in the lateral direction can form a step profile, especially with the adjacent surface areas of the top side of the semiconductor layer sequence. The at least one first partial region can run at least partly parallel to the ridge waveguide structure so that a current can be applied parallel to the ridge waveguide structure. The at least one first partial region can at least partially overlap with the ridge waveguide structure, especially when the substrate is viewed from the bottom side. This allows current imprinting from the substrate side as close as possible to the active region of the active layer.

The partial annealing described here and thus the partial alloying of the contact layer has the advantage that the ohmic behavior of the contact layer is improved compared to completely unannealed contacts without the epitaxial electrode layer being thermally damaged. Overall, this results in a significant reduction in the operating voltage compared to corresponding unannealed laser diodes, which is reflected in increased efficiency. It is of essential importance for application of the described method that the preferably laser-supported annealing process, which only acts locally in the at least one first partial region, leads to a corresponding local alloying process and thus not to a full-surface mixing of the contact layer on the bottom side of the substrate. This enables a subsequent low-loss electrical and thermal assembly of the component. In particular, the process can prevent gallium from a Ga-containing substrate or titanium from the contact layer from reaching the surface of the contact layer over a large area where it would lead to an electrical and thermal deterioration of the component properties after unavoidable oxidation. The corresponding oxidation only takes place in one or more of the first partial regions, while the contact layer in one or more of the second partial regions remains unaffected by annealing. Depending on the type of subsequent mounting of the semiconductor laser with the contact layer up or down on a heat sink, there are advantageous designs in which the alloying of the contact layer takes place specifically only in one or more desired first partial regions of the contact layer. For example, if the semiconductor laser is later mounted with the electrode layer on the epitaxial side facing downwards by soldering it onto a heat sink, a second partial region of the contact layer can remain unannealed and thus be omitted from the alloying process intended for application of a bonding wire. In a desired more homogeneous current application, e.g. for power lasers with high operating currents, several such second partial regions can also be advantageous, whereby correspondingly more bonding wires can be used.

Another technologically advantageous combination is the integration of additional stress-relaxing structures in the partial annealing areas formed by the first partial regions. These relaxation structures generated by etching or laser-induced material removal, for example, can be advantageous for large-area chips or laser bars to reduce bowing of the component and thus enable a stable mounting with low loss and low stress.

Further advantages, examples and developments are revealed by the examples described below in connection with the figures.

In the examples and figures, identical, similar or identically acting elements are each provided with the same reference numerals. The elements illustrated and their size ratios to one another should not be regarded as being to scale, but rather individual elements such as, for example, layers, components, devices and regions, may have been made exaggeratedly large to illustrate them better and/or to aid comprehension.

Figure 1B:
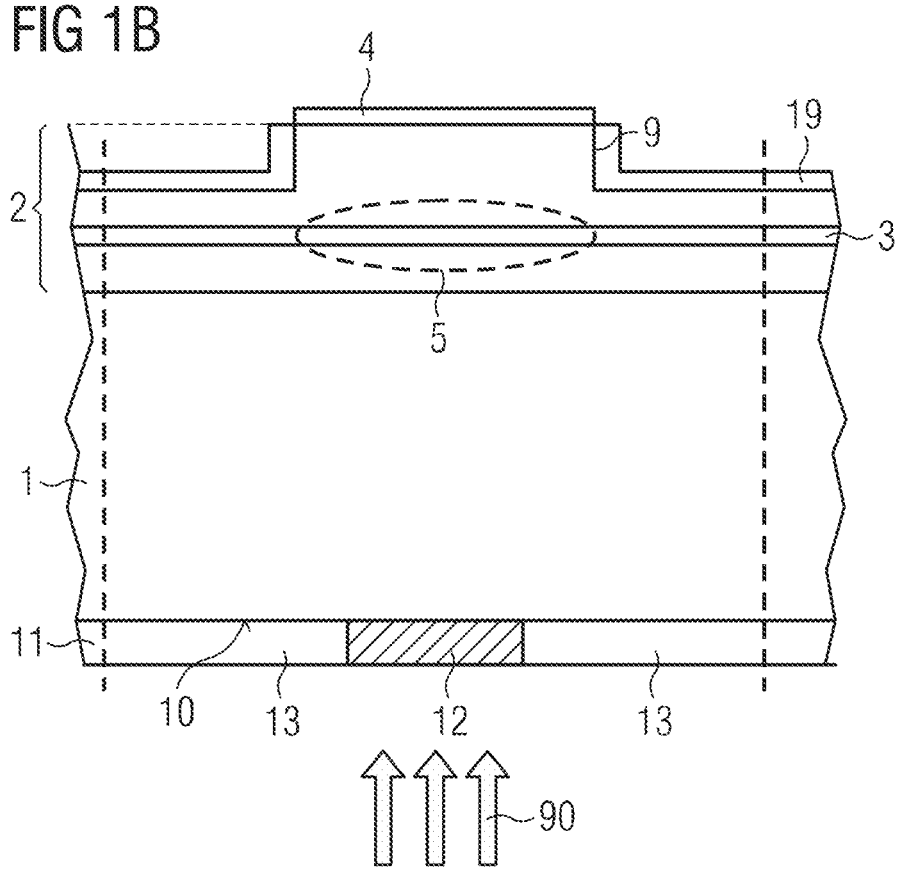
Figure 1C:
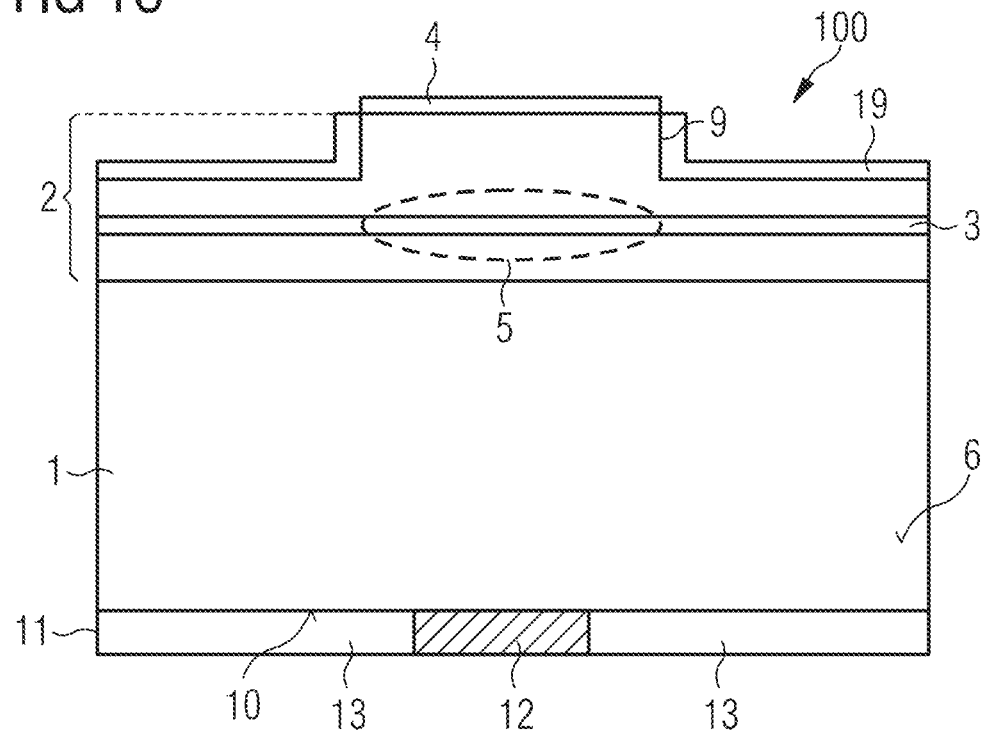
Figure 1D:
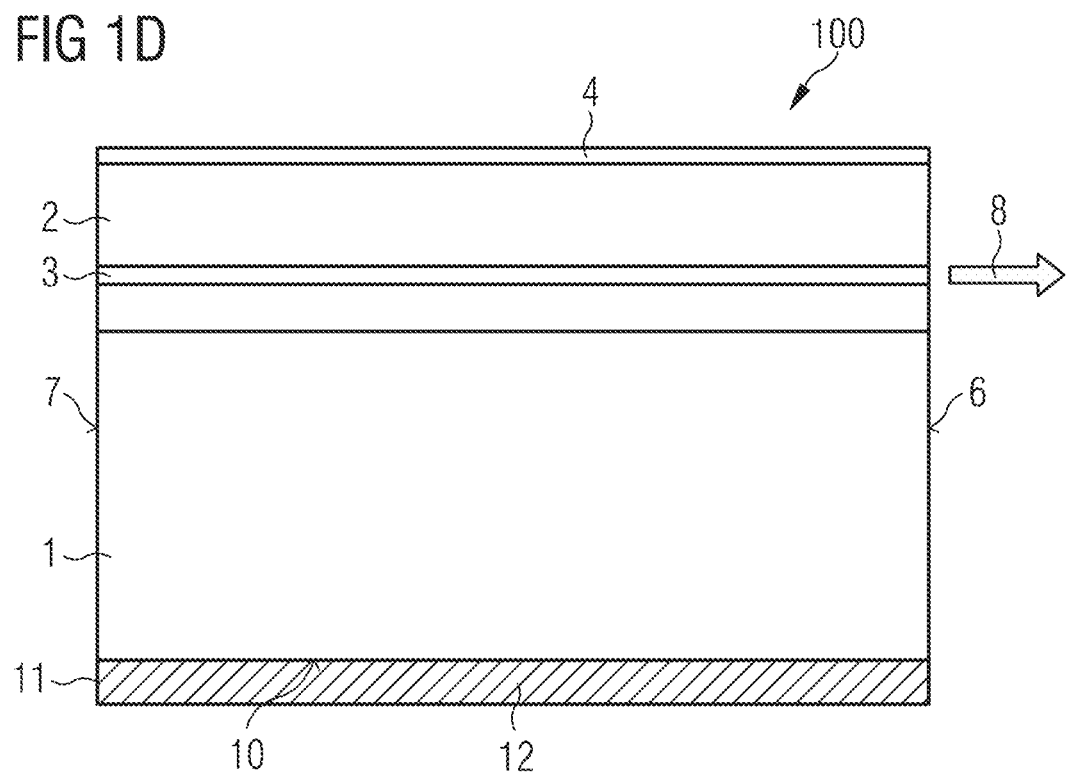
Figure 1E:
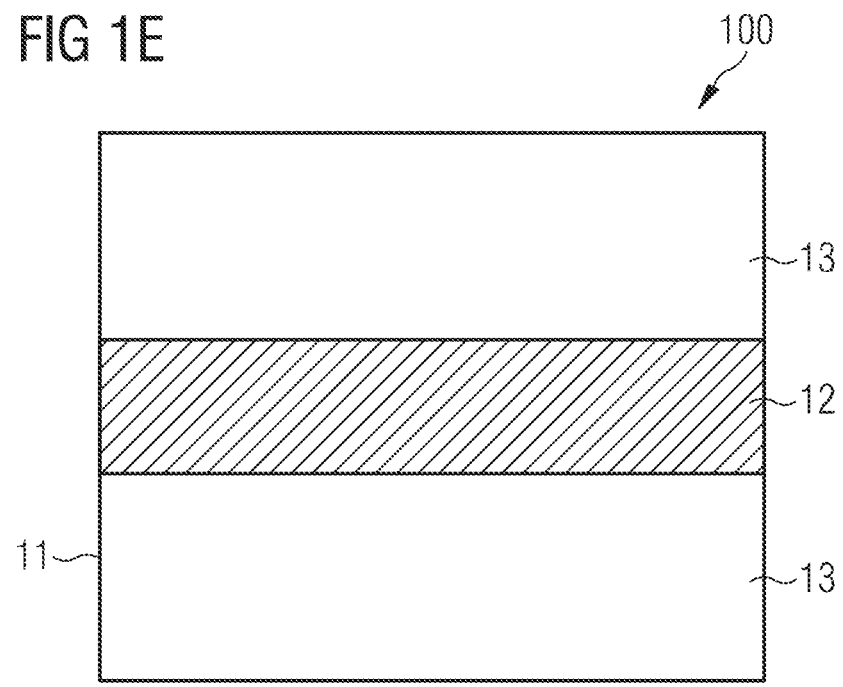

FIGS. 1A to 1E show an example of a method of manufacturing a semiconductor laser diode 100, wherein FIGS. 1A and 1B show sectional illustrations of a wafer composite. The area corresponding to a later singulated semiconductor laser 100 is indicated in FIGS. 1A and 1B by the dotted vertical lines. FIGS. 1C to 1E show views of a singulated and finished semiconductor laser 100 in a view toward the light outcoupling surface 6, a section through the semiconductor laser diode 100 with a section plane perpendicular to the light outcoupling surface 6, and a view toward the bottom side 10 of substrate 1.

As shown in FIG. 1A, a substrate 1 in the form of a wafer is provided for the manufacturing of the semiconductor laser 100, which is, for example, a growth substrate for a semiconductor layer sequence 2 epitaxially grown thereon. Alternatively, the substrate 1 can also be a carrier substrate to which a semiconductor layer sequence 2 grown on a growth substrate is transferred after growth. For example, the substrate 1 may be made from GaN, on which a semiconductor layer sequence 2 based on an InAlGaN compound semiconductor material is grown. In addition, other materials are also possible for the substrate 1 and the semiconductor layer sequence 2. The semiconductor layer sequence 2 has an active layer 3 that generates light 8 during operation, in particular laser light when the laser threshold is exceeded, and emits it via a facet formed as a light outcoupling surface 6, as indicated in FIG. 1D. In addition to the active layer 3, the semiconductor layer sequence 2 may contain further semiconductor layers such as cladding layers, waveguide layers, barrier layers, current spreading layers and/or current limiting layers not shown to simplify the illustration. In particular, the semiconductor layer sequence 2 may have an n-doped and a p-doped side formed by respective semiconductor layers and between which the active layer 3 is arranged. As an example, the semiconductor layer sequence 2 in the shown example is first grown on the substrate 1 with the n-doped semiconductor layers, then with the active layer 3 and on top of this with the p-doped layers. Alternatively, reverse polarity of the semiconductor layer sequence 2 on the substrate 1 may be possible, especially if the substrate 1 is formed by a carrier substrate.

On the side of the semiconductor layer sequence 2 facing away from the substrate 1, i.e. on the epitaxial side, an electrode layer 4 is applied which is provided for electrical contacting of the semiconductor layer sequence 2 from the epitaxial side. For example, the electrode layer 4 may contain one or more of the following metals: Ag, Al, Au, Pt, Pd. In the top side of the semiconductor layer sequence 2 facing away from the substrate 1, a ridge waveguide structure 9 is formed by removing part of the semiconductor material from the side of the semiconductor layer sequence 2 facing away from the substrate 1. The ridge waveguide structure 9 runs in a longitudinal direction and is bounded on both sides in the lateral direction by lateral surfaces. The ridge side surfaces and the remaining top side of the semiconductor layer sequence 2 are covered by a passivation material 19, for example, an electrically insulating oxide, nitride or oxynitride with one or more materials selected from Si, Al and Ti. Due to the refractive index jump at the side surfaces of the ridge waveguide structure 9 because of the transition from the semiconductor material to the passivation material 19, a so-called index guidance of the light produced in the active layer 3 can be effected, which can substantially lead to formation of an active region 5, which indicates the region in the semiconductor layer sequence 2 in which the produced light is guided and amplified in laser operation. Alternatively, the semiconductor laser diode 100 can also be designed as a so-called wide-strip laser diode without a ridge waveguide structure.

Furthermore, after singulation of the wafer composite, reflective or partially reflective or anti-reflective layers or layer sequences also not shown for the sake of clarity and provided and arranged for formation of an optical resonator in the semiconductor layer sequence 2, may be applied to the light outcoupling surface 6 and the opposite rear surface 7, which form side surfaces of the semiconductor layer sequence 2 and of the substrate 1 as shown in FIGS. 1C and 1D.

After the method step shown in FIG. 1A of providing the substrate 1 having the semiconductor layer sequence 2 with the active layer 3, a contact layer 11 is deposited on the bottom side 10 of the substrate 1 opposite the semiconductor layer sequence 2, as shown in FIG. 1B. Together with the electrode layer 4 on the semiconductor layer sequence 2, the contact layer 11, during operation of the semiconductor laser 100, injects current into the semiconductor layer sequence 2 and in particular into the active layer 3. The contact layer 11 has at least one first partial region 12 and at least one second partial region 13, which are continuously formed. The at least one first partial region 12 and the at least one second partial region 13 form a continuous part of the contact layer 11 and directly adjoin each other in a lateral direction. In particular, the first contact layer 11 is applied over a large area and all first and second partial regions 12, 13 have, immediately after application, the same structure and composition. If an edge region of the later singulated semiconductor laser 100, as shown in some examples below, is to be free of the contact layer 11, the contact layer can still be structured accordingly in the wafer composite so that the bottom side 10 is free of the contact layer 11 at the boundaries of adjacent semiconductor lasers, i.e. in the region of the vertical dashed lines drawn in FIGS. 1A and 1B.

In the example shown, the contact layer 11 has a single layer or preferably a layer structure with metallic layers. In particular, the contact layer 11 may comprise, directly on the bottom side 10 of substrate 1, an adhesion promoting layer, for example, or with Ti, thereover one or more diffusion barrier layers, for example, or with one or more materials selected from Pt, Pd, Ni, Cr and TiWN, and thereover a layer of or with Au. When the semiconductor laser 100 with the electrode layer 4 is soldered to a heat sink and electrically connected to the contact layer 11 by a bonding wire, the uppermost layer of the contact layer 11 with or of Au may have a thickness of preferably greater than or equal to 400 nm and less than or equal to 1.5 µm. If the semiconductor laser 100 is to be soldered with the contact layer 11 onto a heat sink, the contact layer can have, on or instead of the described Au layer, one or more further diffusion barrier layers and a further layer made of or with Au, which has a smaller thickness.

After application, the contact layer 11 is annealed by irradiation 90 in at least one first partial region 12, as indicated in FIG. 1B. In particular, the contact layer 11 is annealed only in the at least one first partial region 12, while the contact layer 11 is annealed in no second partial region 13. The irradiation 90, which is particularly preferably provided by a light source, causes a local temperature increase in the at least one first partial region 12, wherein in the at least one first partial region 12 materials of the contact layer 11 and the substrate 1 are mixed. Annealing can thus cause alloying of at least part of the contact layer 11 in the at least one first partial region 12, while the contact layer 11 remains unchanged in the at least one second partial region 13 and no material mixing and thus no alloying takes place there. The at least one second partial region 13 remains unannealed especially in the finished semiconductor laser 100. The irradiation is preferably effected by laser light which, for example, can cover the at least one first partial region 12 by scanning, and particularly preferably comprises a wavelength at least partially absorbed by the substrate 1.

By local annealing only in the at least one first partial region 12, in particular the layer structure of the contact layer 11 is changed there and a mixture of materials at the interface between the substrate 1 and the contact layer 11 is produced, as described above, by at least partial melting of the respective materials. This leads to a significant improvement in the flux voltage of the semiconductor laser 100, as we demonstrated experimentally several times. Furthermore, local annealing in the at least one partial region 12 may result in embrittlement of the Au-containing layer and migration of Ti from the adhesion promoting layer and/or Ga from the substrate 1 to the surface and in oxidation there. As a result, the contact layer 11 is no longer easily bondable or solderable in the at least one first partial region 12, but has the low contact resistance described above. In the unannealed at least one second partial region 13, however, the contact layer 11 keeps its desired structure and its good bondability or solderability. In the shown example, the first partial region 12 runs between the facets in a strip parallel to the ridge waveguide structure 9, i.e. from the light outcoupling surface 6 to the rear surface 7, and overlaps with the ridge waveguide structure 9 in a view along the growth direction of the semiconductor layer sequence 2. In other words, the first partial region 12 is arranged below the ridge waveguide structure 9 so that the shortest possible current path in the semiconductor layer sequence 2 during operation is achieved.

After local annealing, the wafer composite is singulated into semiconductor lasers 100, one of which is shown in FIGS. 1C to 1E. In the shown example, the contact layer 11 in the singulated semiconductor laser 100 has an annealed strip-shaped first partial region 12, which runs purely exemplarily parallel to and overlaps the ridge waveguide structure 9 and is arranged between two unannealed second partial regions 13. Due to the contact layer 11, which is only partially alloyed, the semiconductor laser 100 exhibits a reduced flux voltage, which leads to a better component efficiency and thus also to an improved component stability. The unalloyed regions of the contact layer 11, on the other hand, ensure good mountability as described above for a reliable, low-loss and thermally controlled soldering or bonding process.

The form, size and number of the first and second partial regions 12, 13 shown in FIGS. 1A to 1E are to be understood as examples only. In particular, the contact layer 11 may have a plurality of first and/or a plurality of second partial regions 12, 13 in different geometric arrangements. For example, a first partial region 12 may have one or more geometric shapes that are selected from: line, cross, circle, ellipse, spiral, grid, square, wavy line, meander and combinations thereof. In the following figures, further examples of the semiconductor laser 100 are shown in a representation corresponding to FIG. 1E, unless otherwise described, which shows contact layers 11 with a large number of possible variations of the first and second partial regions 12, 13. In particular, the shown different variations of the first and second partial regions 12, 13 of the contact layers 11 can also be combined with each other.

Figure 2A:
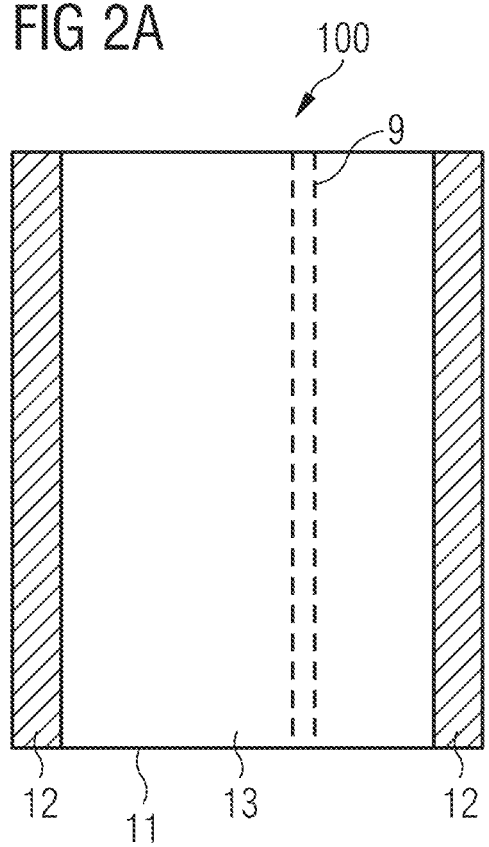

The semiconductor laser 100 shown in FIG. 2A has a contact layer 11 which, as in the previous example, is applied over the entire surface of the bottom side of the substrate and completely covers it. In contrast to the previous example, however, the contact layer 11 has two first partial regions 12 between which, in the lateral direction, a second partial region 13 is arranged. For better illustration, the purely exemplary position of the ridge waveguide structure 9 is also indicated by the dotted area. The first two partial regions 12 are arranged in lateral edge regions of the bottom side of the substrate. This may allow homogeneous current imprinting from the substrate edges, while the second partial region 13 in between is intended for electrical connection by a bonding wire or for assembly by soldering. Furthermore, it can be advantageous if the substrate is also damaged by the local annealing in the first partial regions 12, in particular by the irradiation, that a fracture nucleation for singulation is formed as a result. The structure shown in FIG. 2A can also be denoted as a so-called scribing structure. The same advantage of combining an alloy structure with fracture nucleations for improved singulation can also be found in the following examples with first partial regions 12 in edge regions of the bottom side of the substrate.

Figure 2B:
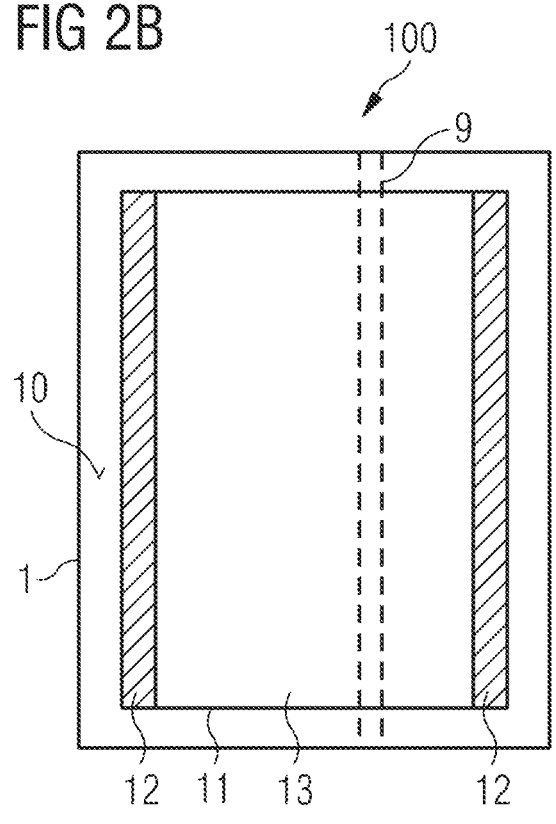

FIG. 2B shows an example in which the bottom side 10 of substrate 1 is free of the contact layer 11 in an edge region. In particular, the semiconductor laser 100 has a laterally circumferential edge region of the bottom side 10 which is free of the contact layer 11. Such a structured contact layer 11 can be advantageous with regard to singulation since uncontrolled tearing of the contact layer 11 can be avoided, for example, during facet breaking during the singulation process.

FIG. 3A shows an example for a contact layer 11, where the arrangement of a first partial region 12 along the ridge waveguide structure 9 and between two second partial regions 13 corresponds to the example described in FIGS. 1A to 1E. In this example, the shortest possible current path in the semiconductor layer sequence is achieved. In contrast to the example of FIGS. 1A to 1E, however, as described in connection with the example of FIG. 2B, a circumferential edge region of the bottom side 10 of the substrate 1 is free of the contact layer 11.

In the examples shown in FIGS. 3B and 3C, the contact layer 11 has several first partial regions 12 parallel to the ridge waveguide structure 9 and overlapping it, separated from each other by a continuous second partial region 13. An improvement of the transverse conductivity of the contact layer 11 can be achieved by the continuous second partial region 13.

Figure 4A:
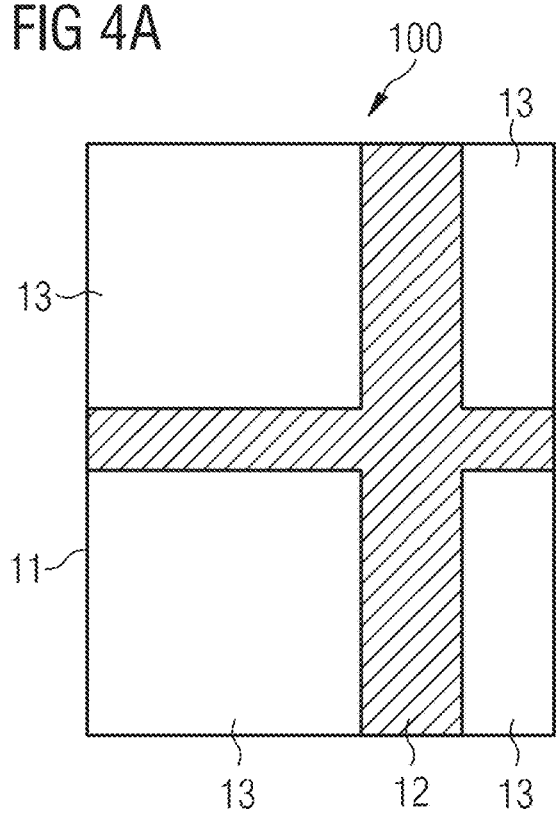
Figure 4B:
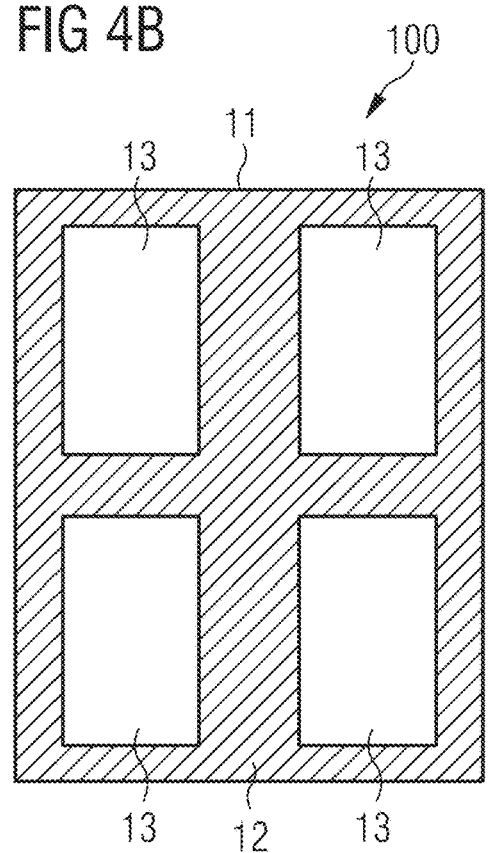
Figure 4C:
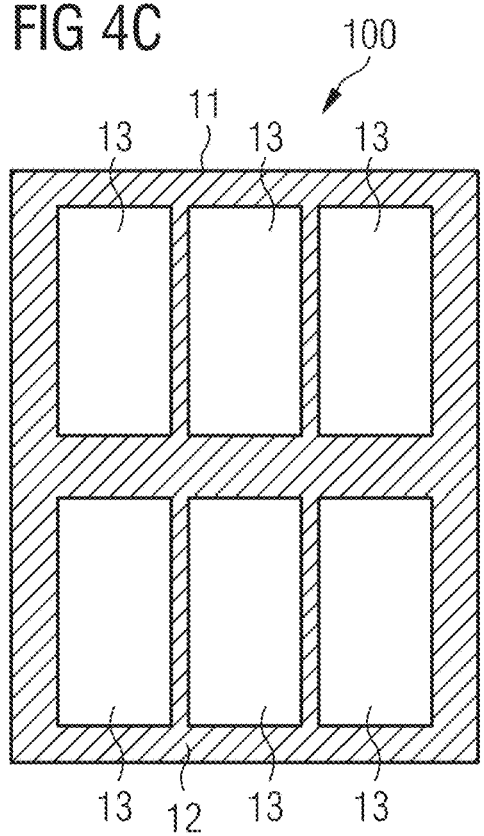

FIG. 4A shows an example of a contact layer 11 with a cross-shaped first partial region 12 separating four second partial regions 13 from each other. For example, each of the second partial regions 13 can be provided for the connection of a bonding wire, which allows a high current injection to be achieved, for example, for high current applications. FIG. 4B shows an example in which the first partial region 12 is additionally formed in a circumferential edge region to improve the electrical connection of the contact layer 11 to the substrate. The example illustrated in FIG. 4C shows, compared to the two previous examples, six second partial regions 13 separated from each other by the continuous first partial region 12. Alternatively, more or fewer second partial regions 13 are also possible.

Figure 4D:
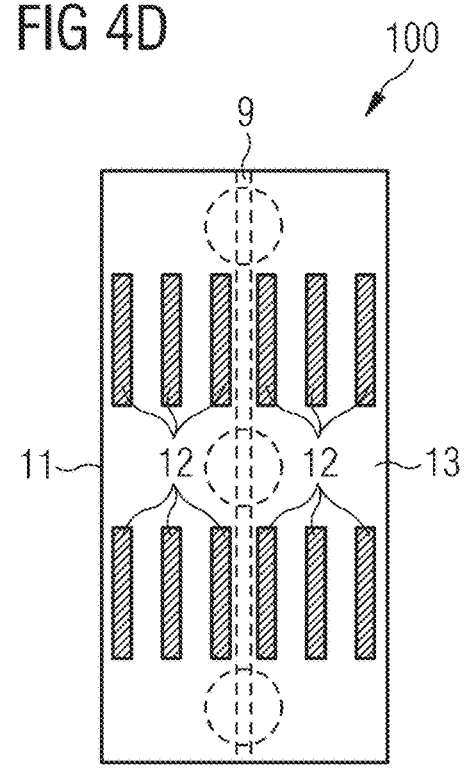

The example shown in FIG. 4D shows, compared to the previous examples, a plurality of first partial regions 12 each parallel to the ridge waveguide structure 9 and arranged in two groups along the beam direction. Each of the groups of the first partial regions 12 has a plurality of the first partial regions 12 in a direction perpendicular to the direction of radiation. The second partial region 13 is formed continuously. In the direction of radiation between the light outcoupling surface and one of the groups of first partial regions 12, between the two groups of partial regions 12 and between the rear side and the other of the two groups, the second partial region 13 has one or more regions each provided for connection of a bonding wire, as indicated by the dotted lines. This allows a high current injection for high-performance diodes to be achieved. The shown number, size and density of the first partial regions 12 and the groups of the first partial regions 12 is to be understood to be only exemplary and can also vary depending on the requirements with regard to the semiconductor laser diode.

Figure 5A:
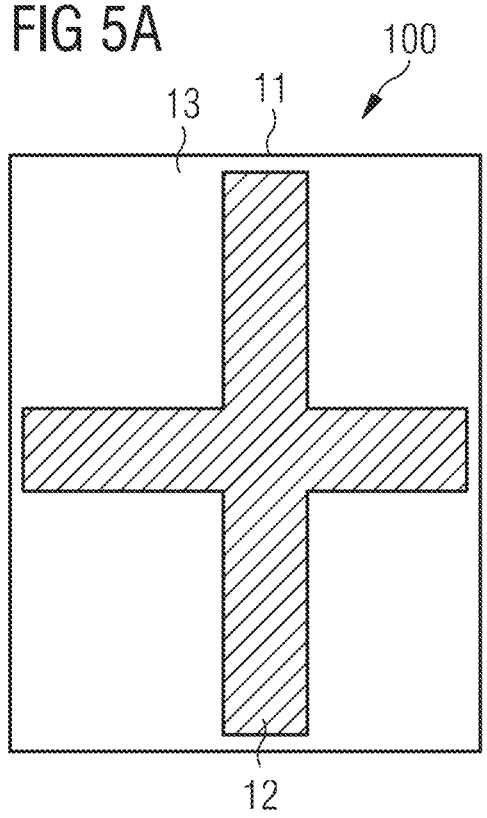
Figure 5B:
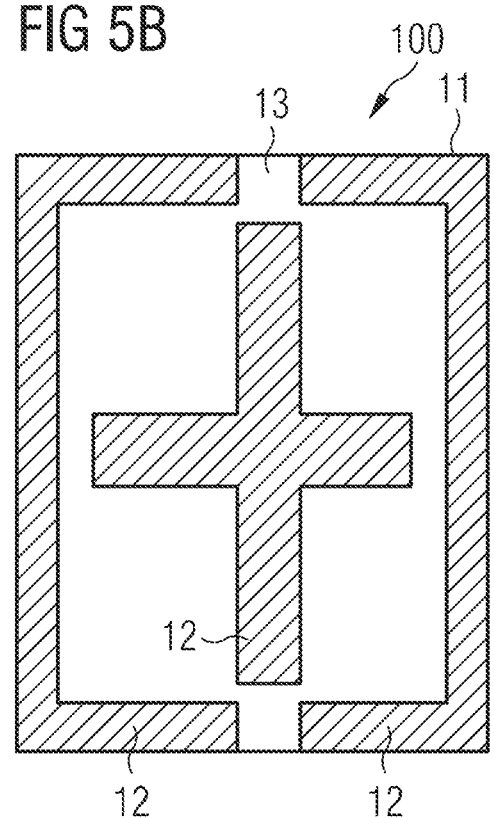
Figure 5C:
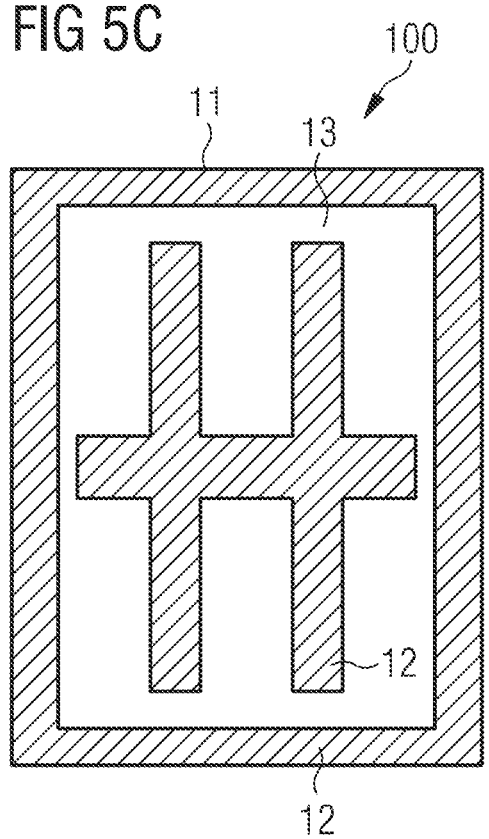

The examples shown in FIGS. 5A to 5C correspond to the examples described in connection with FIGS. 4A to 4C, wherein the second partial regions 13 in FIGS. 4A to 4C, which are separated from each other, are each formed as a continuous second partial region 13 in the examples of FIGS. 5A to 5C to improve the transverse conductivity of the contact layer 11.

Figure 6A:
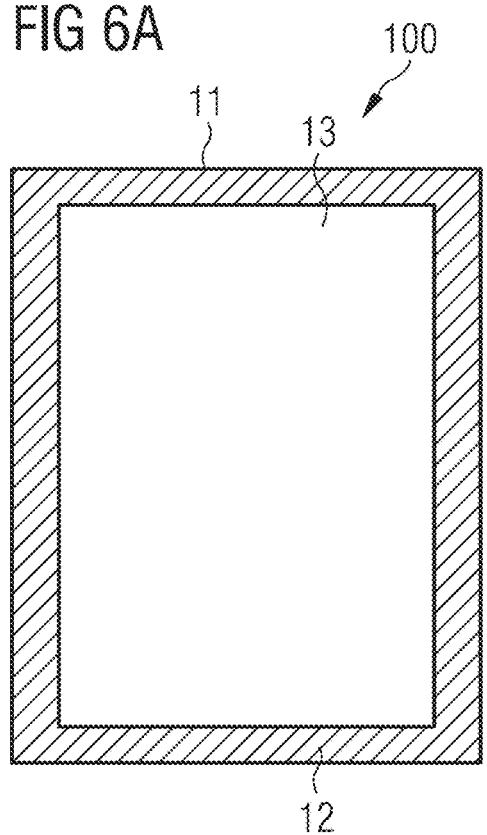
Figure 6B:
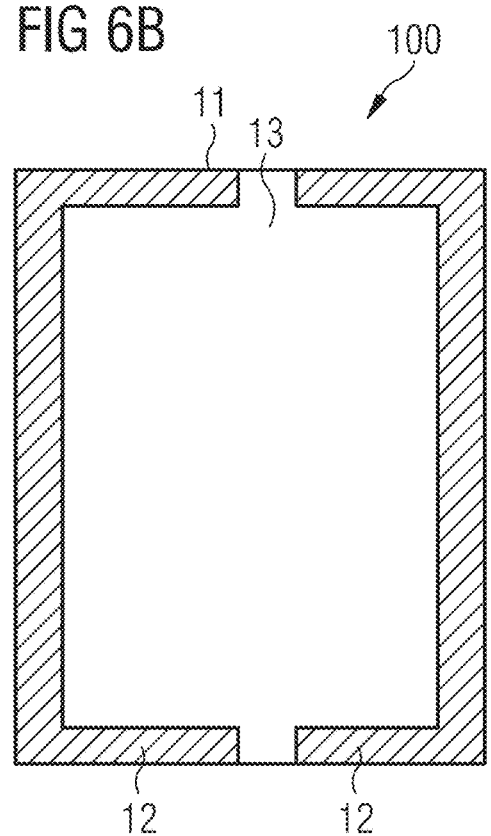
Figure 6C:
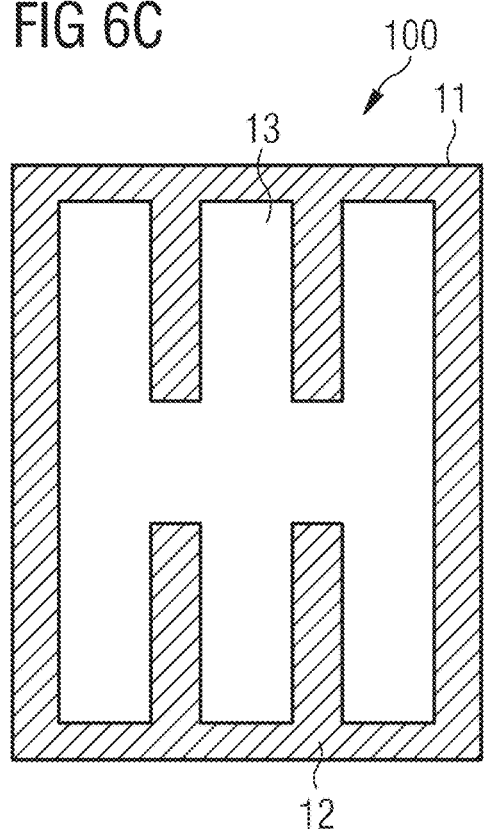

FIG. 6A shows an example of a contact layer 11 having a first partial region 12 in a laterally circumferential edge portion of the bottom side of the substrate that completely surrounds a second partial region 13 in a lateral direction. In the example of FIG. 6B, in contrast, the region at the facets is omitted in which the ridge waveguide structure is arranged. The contact layer 11 of the example shown in FIG. 6C, on the other hand, has a first partial region 12 circumferential along the edge, which additionally has finger-like structures protruding into a central region to enable a more homogeneous electrical connection of the contact layer 11 to the substrate.

Figure 8B:
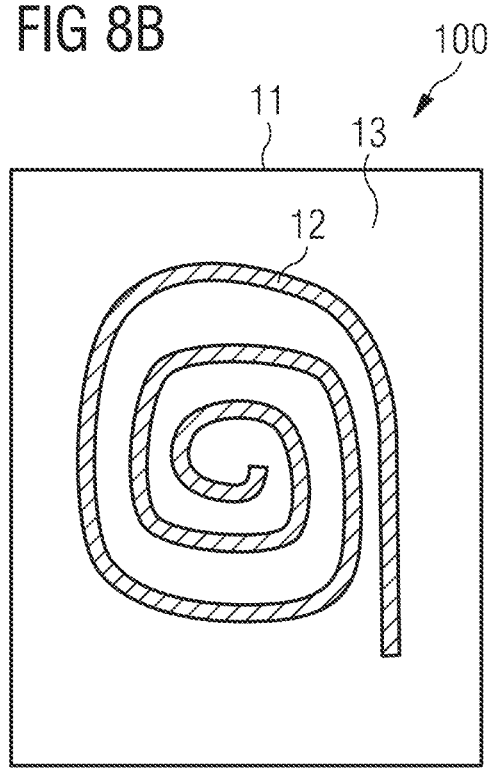
Figure 8C:
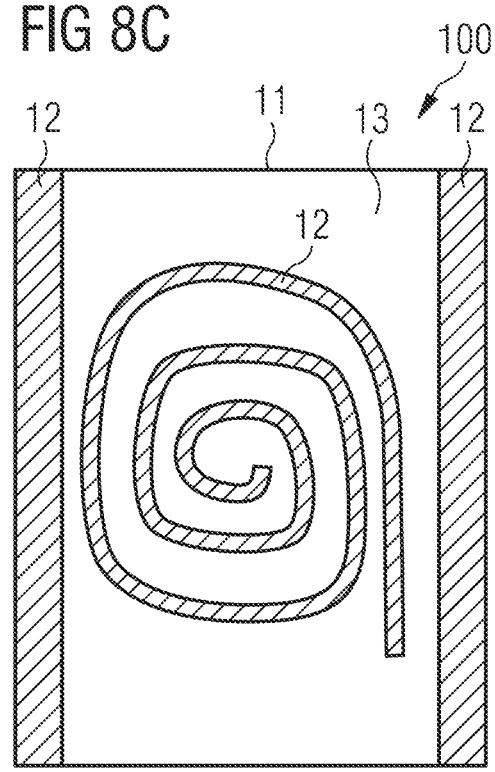

The examples shown in FIGS. 7A to 7C and FIGS. 8A to 8C have serpentine-like or meander-shaped as well as spiral-shaped first partial regions 12. In FIGS. 7A and 8A, the bottom side 10 of the substrate 1 is free of the contact layer 11 in a circumferential edge region, while the contact layers 11 of the examples of FIGS. 7B and 8B are applied over the entire surface. The examples shown in FIGS. 7C and 8C show additional first partial regions 12 at the edges in the form of a scribing structure for easier singulation described above in connection with FIG. 2A.

Figure 9A:
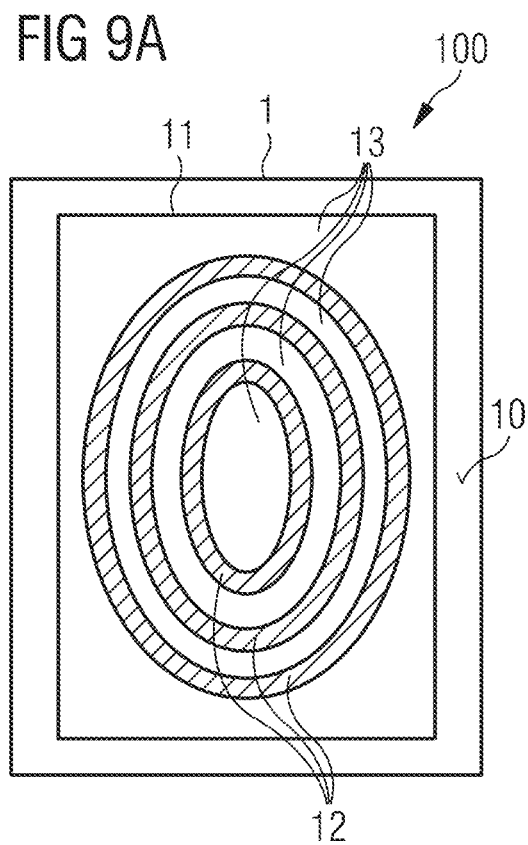
Figure 9B:
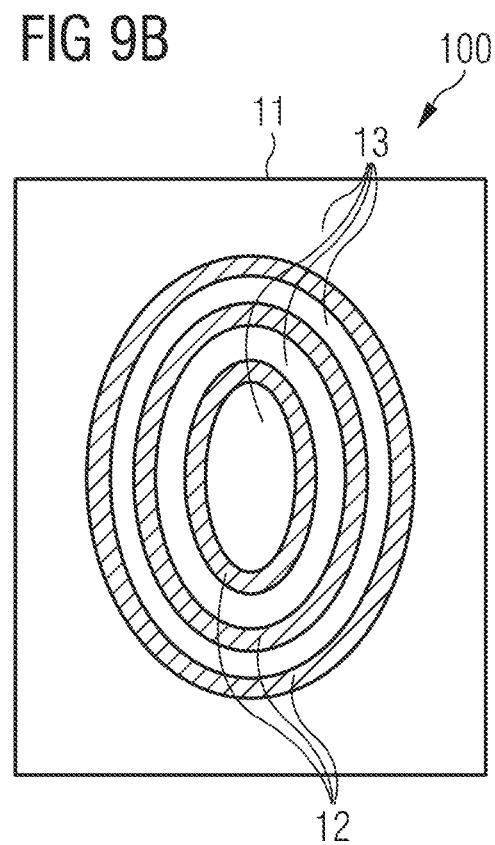
Figure 9C:
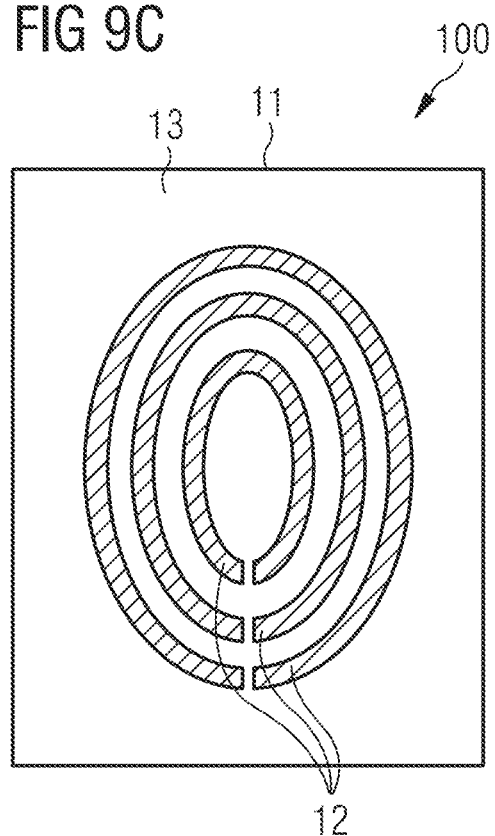

FIGS. 9A and 9B show contact layers 11 applied with a free circumferential edge region (FIG. 9A) or over the entire surface (FIG. 9B) and have circular first partial regions 12 separated from each other by corresponding second partial regions 13. FIG. 9C shows an example in which the first circular partial regions 12 are open so that a continuous second partial region 13 is formed to improve the transverse conductivity of the contact layer 11.

Figure 10A:
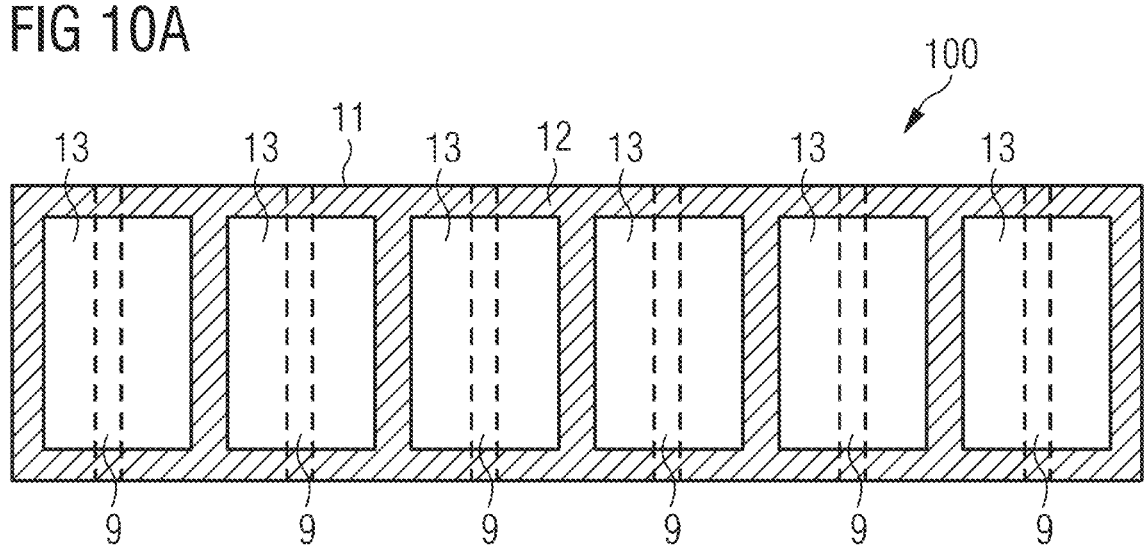
FIGS. 10A to 10D show schematic illustrations of semiconductor lasers according to further examples.
Figure 10B:
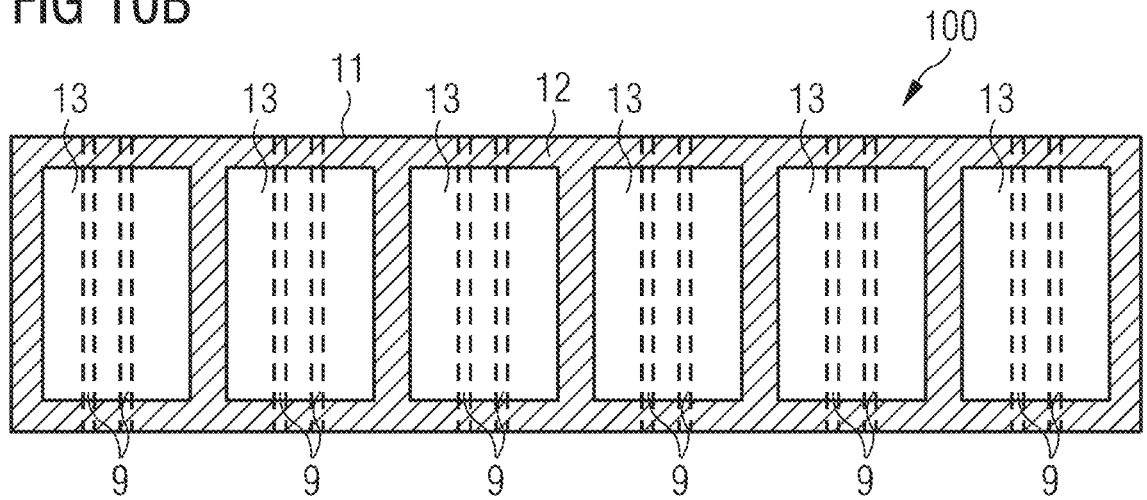
Figure 10C:
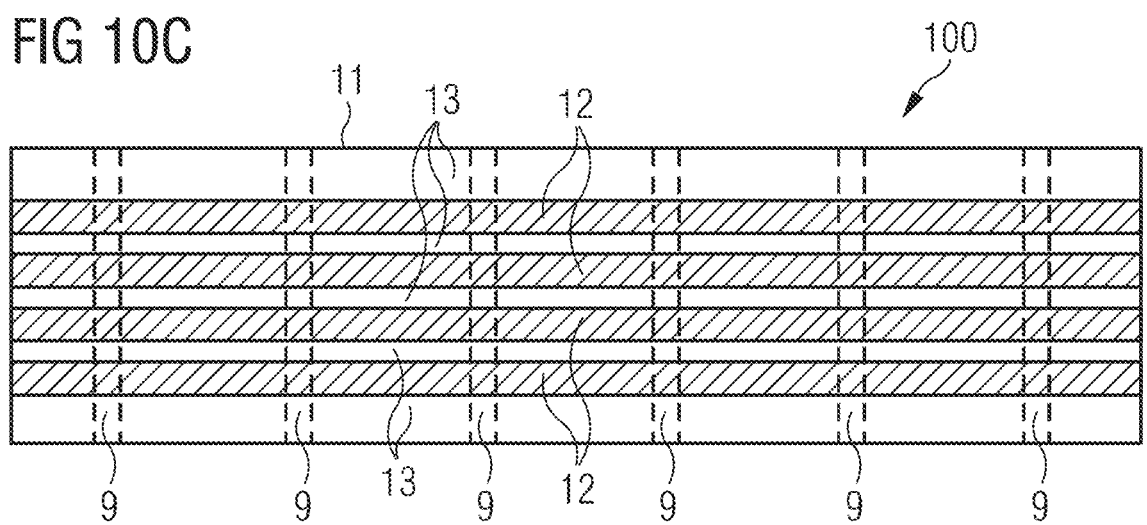
Figure 10D:
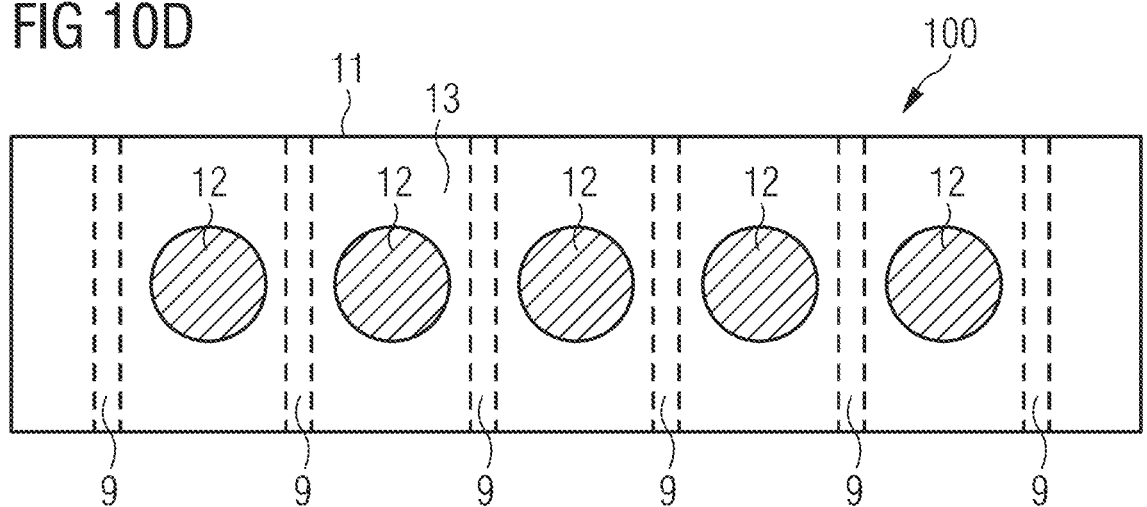

While the semiconductor lasers 100 described in the previous examples are designed as single emitters, semiconductor lasers 100 designed as laser bars are shown in FIGS. 10A to 10D, each of which has a plurality of ridge waveguide structures 9 and thus a plurality of active areas that emit laser light. The number of ridge waveguide structures 9 in FIGS. 10A to 10D is to be understood purely as an example and can preferably be greater than or equal to 2 and less than or equal to 50. A contact layer 11 can be applied to the bottom side of the substrate in a continuous manner in each example, the contact layer 11 having a first partial region 12 being circumferential and, purely as an example, between adjacent active regions (FIG. 10A) or pairs of adjacent active regions (FIG. 10B). As shown in FIG. 10C, the first partial regions 12 can also extend transversally across the active areas. Furthermore, the first partial regions 12 can also be arranged between the active areas as shown in FIG. 10D. As an alternative to the shown shapes of the first and second partial regions 12, 13, they can also be designed as described in the other examples.

Figure 11A:
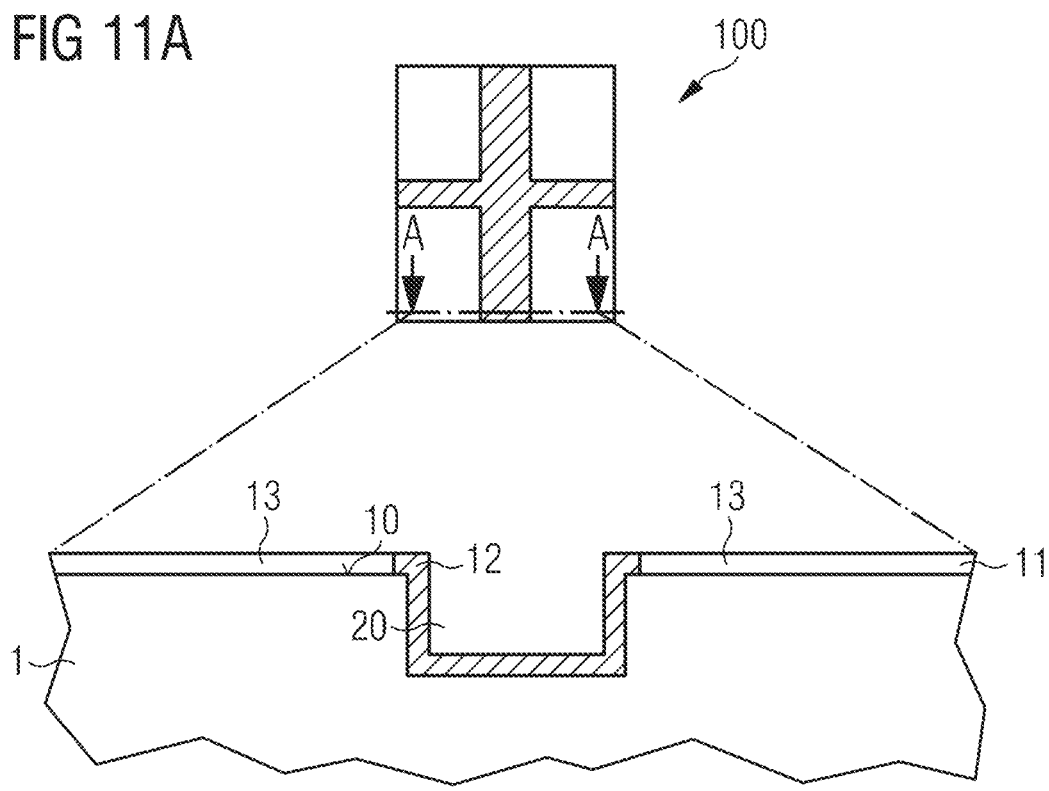
FIGS. 11A to 11C show schematic illustrations of semiconductor lasers according to further examples.

FIG. 11A shows a semiconductor laser 100 according to a further example in a view toward the contact layer 11 and in a section of a sectional view along the indicated sectional plane AA, in which the substrate 1 has a surface structure 20 on the bottom side 10 which is formed as a depression. As an example, the contact layer 11 is embodied with regard to the first and second partial regions 12, 13 as described above in connection with FIG. 4A. Alternatively, the surface structure 20 can also be combined with any other example. The contact layer 11 applied on the bottom side 10 has at least one first partial region 12 which is arranged in the depression. In particular, the at least one first partial region 12 can cover the entire depression as shown in the example. In other words, wherever the first partial region 12 of the contact layer 11 is formed, there is also a depression in the bottom side 10 of the substrate 1. The surface structure 20 can be formed, with regard to the course of one or more depressions such as the first partial regions 12, as shown in connection with the examples described above.

The surface structure can be produced, for example, by etching or laser ablation before the contact layer 11 is applied to the bottom side 10 of the substrate 1. During partial annealing of the contact layer 11, the bottom side 10 can then be scanned by laser irradiation along the surface structure 20 so that the depression or depressions is/are covered with one or more first partial regions 12. The surface structure 20, for example, can lead to an increase in the contact area between the first partial region 12 and the substrate 1 and to a reduction in the substrate thickness in the area of the first partial region 12, which can lead to a lower electrical resistance of the semiconductor laser 100. Furthermore, the surface structure can lead to an improvement with regard to tensions due to the combination of alloy- and tension-relaxing structures.

Figure 11B:
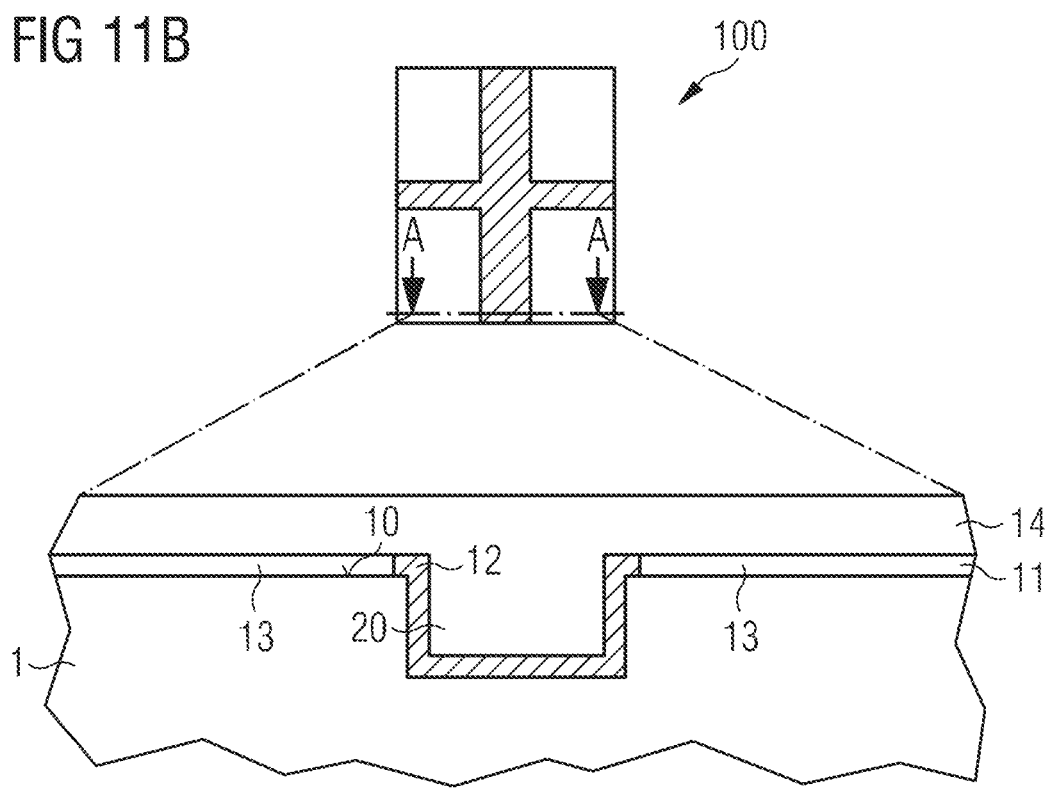

In FIG. 11B a semiconductor laser 100 is shown according to an example in a view on the contact layer 11 and in a section of a sectional view along the sectional plane AA. Compared to the example in FIG. 11A, the contact layer 11 in the example in FIG. 11B has a further layer 14 over the first and second partial regions 12, 13 applied after local annealing. Also, the further layer 14 can be applied only to the at least one first or second partial region 12, 13. As shown, the further layer 14 can be applied over a large area, i.e. on all first and second partial regions 12, 13, and can, for example, have Au or be made of Au. If the bottom side 10 of the substrate 1 has a surface structure 20, i.e. in particular one or more depressions, as in the shown example, the further layer 14 can also serve in particular for planarization, which levels out the surface structure 20. The further layer 14 can also be part of the contact layers 11 of all the other described examples.

Figure 11C:
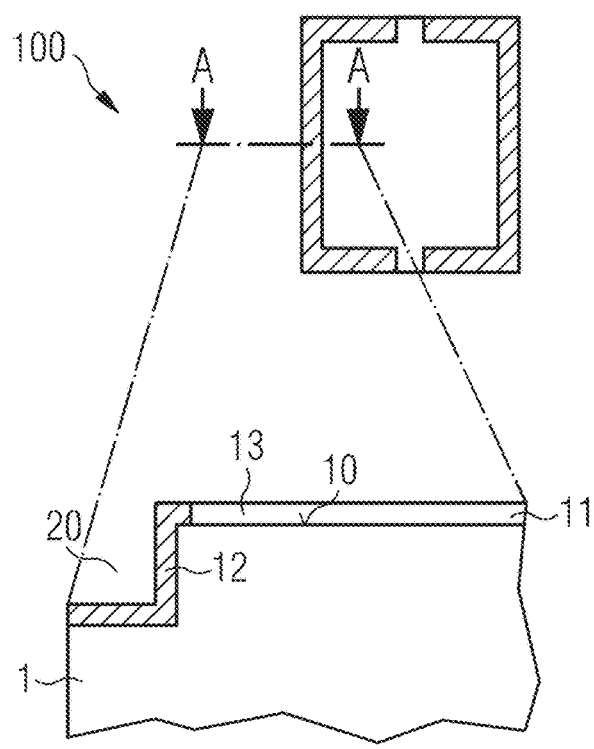

FIG. 11C shows a semiconductor laser 100 according to a further example in a view toward the contact layer 11 and in a section of a sectional view along the drawn sectional plane AA, in which the surface structure 20 has a depression in an edge region of the bottom side 10 of the substrate 1. At the same time, the contact layer 11 in this edge region is locally annealed so that a first partial region 12 is formed in the edge region. As an example, the contact layer 11 is embodied with regard to the first and second partial regions 12, 13 as described above in connection with FIG. 6B. Alternatively, the surface structure 20 can be combined with a depression at the edge or with any other example. The trench forming the depression combined with the locally alloyed first partial region 12 at the chip edge covering the depression allows not only an improved electrical contact between the contact layer 11 and the substrate 1, but also an improved singulation process, in particular by breaking the substrate 1 in the region of the depression at the edge. In particular, this can result in an improved facet fracture quality.

Figure 12A:
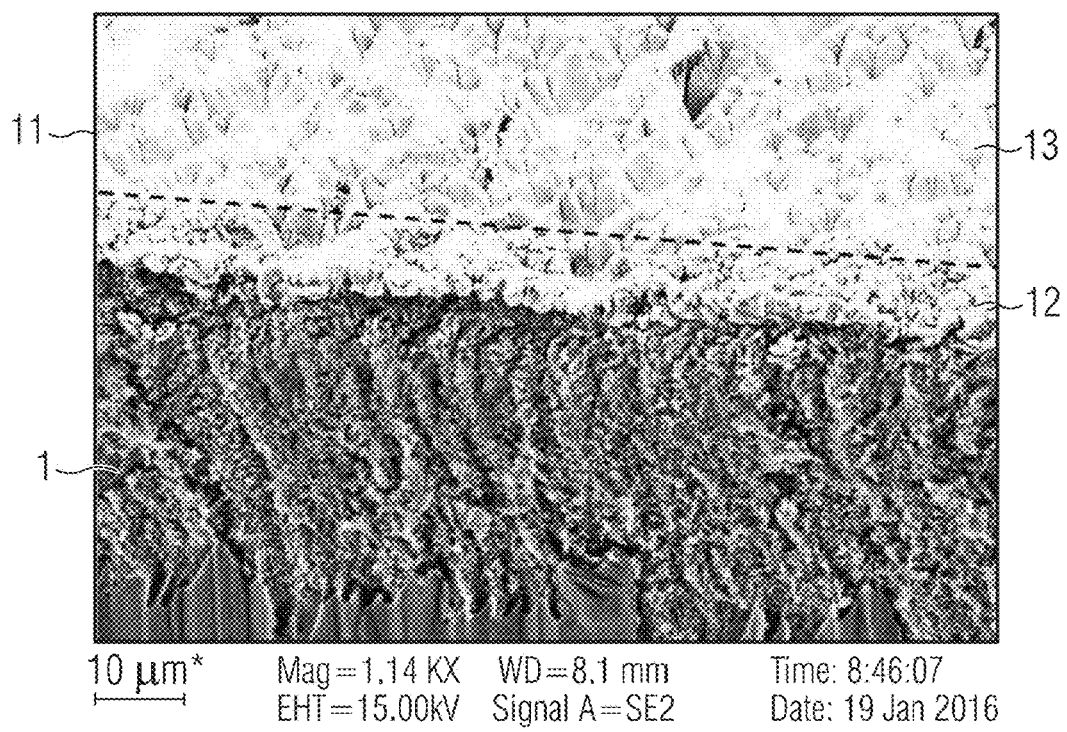
FIGS. 12A to 12C show images of sections of semiconductor lasers according to further examples.
Figure 12B:
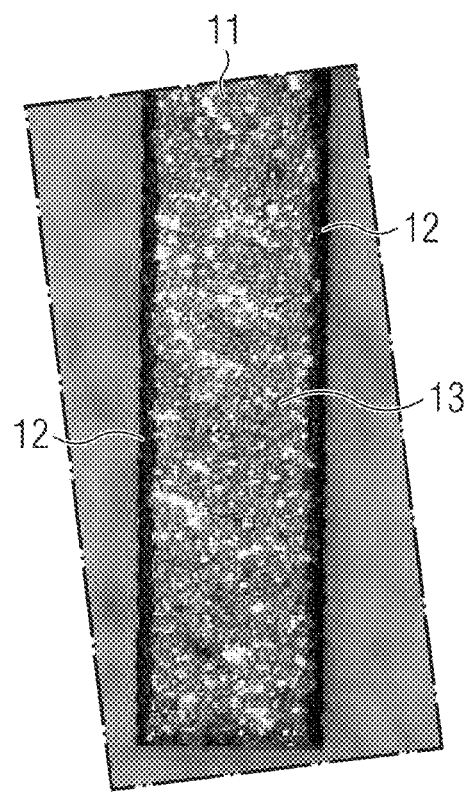
Figure 12C:
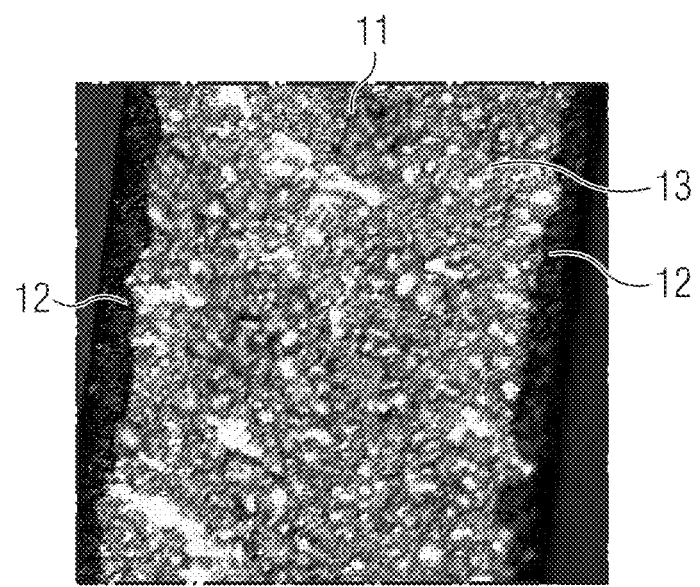

FIGS. 12A to 12C show images of sections of a semiconductor laser embodied purely exemplarily as the example described above in connection with FIG. 2A. The locally annealed first partial regions 12 and unannealed second partial regions 13 of the contact layer 11 are clearly visible.

The examples illustrated in the figures can also be combined with one another, even if not all such combinations are explicitly shown. Furthermore, the examples shown in the figures may have additional and/or alternative features according to the description in the general part.

Our lasers and methods are not limited by the description based on the examples. Rather, this disclosure includes each new feature and each combination of features, which includes in particular each combination of features in the appended claims, even if the feature or combination itself is not explicitly explained in the claims or examples.

This application claims priority of DE 10 2016 120 685.7, the subject matter of which is incorporated herein by reference.

The invention claimed is:

1. A method of manufacturing a semiconductor laser comprising:
    providing a substrate having a semiconductor layer sequence with an active layer that generates light during operation of the semiconductor laser,
    applying a continuous contact layer having at least one first partial region and at least one second partial region on a bottom side of the substrate opposite the semiconductor layer sequence, wherein the bottom side of the substrate has a surface structure comprising a depression in the at least one first partial region, and
    locally annealing the continuous contact layer only in the at least one first partial region.

2. The method according to claim 1, wherein the local annealing is performed by a laser-based irradiation process.

3. The method according to claim 2, wherein the laser-based irradiation process uses laser light that is at least partially absorbed by the substrate.

4. The method according to claim 1, wherein the continuous contact layer is applied to the bottom side of the substrate over the whole surface.

5. The method according to claim 1, wherein the continuous contact layer covers the bottom side of the substrate over the whole surface except for an edge region.

6. The method according to claim 1, wherein the continuous contact layer comprises a plurality of layers.

7. The method according to claim 6, wherein a further layer of the continuous contact layer is applied after annealing.

8. The method according to claim 7, wherein the further layer is applied at least to the first partial region.

9. The method according to claim 1, wherein the continuous contact layer has a plurality of first partial regions separated from one another by one or more second partial regions and that are locally annealed.

10. The method according to claim 1, wherein the at least one first partial region is arranged in an edge region of the continuous contact layer.

11. The method according to claim 1, wherein the semiconductor layer sequence comprises a ridge waveguide structure and the at least one first partial region extends parallel to the ridge waveguide structure.

12. The method according to claim 11, wherein the at least one first partial region overlaps with the ridge waveguide structure when viewed from the bottom side of the substrate.

13. The method according to claim 1, wherein the at least one first partial region has one or more geometric shapes selected from the group consisting of line, cross, circle, ellipse, spiral, grid, square, wavy line, meander.

14. A method of manufacturing a semiconductor laser comprising:

providing an electrically conductive substrate having a semiconductor layer sequence with an active layer that generates light during operation of the semiconductor laser, applying a continuous contact layer having at least one first partial region and at least one second partial region on a bottom side of the electrically conductive substrate opposite the semiconductor layer sequence, and locally annealing the continuous contact layer only in the at least one first partial region, wherein the at least one second partial region remains unannealed in the finished semiconductor laser.

* * * * *